US010396167B2

(12) United States Patent
Tanaka et al.

(10) Patent No.: US 10,396,167 B2
(45) Date of Patent: Aug. 27, 2019

(54) SEMICONDUCTOR DEVICE

(71) Applicant: FUJI ELECTRIC CO., LTD., Kawasaki-shi, Kanagawa (JP)

(72) Inventors: Takahide Tanaka, Matsumoto (JP); Masaharu Yamaji, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 135 days.

(21) Appl. No.: 15/375,947

(22) Filed: Dec. 12, 2016

(65) Prior Publication Data

US 2017/0170285 A1 Jun. 15, 2017

(30) Foreign Application Priority Data

Dec. 15, 2015 (JP) ................................ 2015-244684
Oct. 4, 2016 (JP) ................................ 2016-196812

(51) Int. Cl.
*H01L 29/40* (2006.01)
*H03K 17/082* (2006.01)
*H03K 17/18* (2006.01)

(52) U.S. Cl.
CPC ........ *H01L 29/405* (2013.01); *H03K 17/0828* (2013.01); *H03K 17/18* (2013.01); *H03K 2217/0063* (2013.01)

(58) Field of Classification Search
None
See application file for complete search history.

(56) References Cited

U.S. PATENT DOCUMENTS 6,150,702 A 11/2000 Funaki et al.
6,525,390 B2 * 2/2003 Tada .................... H01L 29/402 257/489
2004/0046225 A1 3/2004 Feiler
2010/0118455 A1 * 5/2010 Kusunoki ....... H01L 21/823878 361/56
2014/0048911 A1 2/2014 Suzuki et al.

FOREIGN PATENT DOCUMENTS

JP 2000-022175 A 1/2000
JP 2000-252426 A 9/2000
JP 2003-008009 A 1/2003
JP 2003-533886 A 11/2003
JP 5748353 B2 7/2015

* cited by examiner

*Primary Examiner* — Ermias T Woldegeorgis
(74) *Attorney, Agent, or Firm* — Rabin & Berdo, P.C.

(57) ABSTRACT

A resistive field plate including a spiral resistive element and meander resistive element is provided in an edge termination structure portion. The spiral resistive element is formed in a spiral planar layout, surrounding the periphery of a high-potential-side region to span from the high-potential-side region to a low-potential-side region. A spiral wire of the spiral resistive element includes a conductive film layer and a thin-film resistive layer connected to each other. The meander resistive element has ends positioned in the high-potential-side region and the low-potential-side region, and is provided in a meandering planar layout. The meander resistive element is provided at a same level as that of the thin-film resistive layer, and faces in the depth direction the conductive film layer of the spiral resistive element, sandwiching an interlayer insulating film therebetween. The conductive film layer of the spiral resistive element and the meander resistive element constitute a field plate.

23 Claims, 25 Drawing Sheets

3b(3)
1
2
3a(3)
20a
11
10a
12
10
10b
22
21
5
20
20b

B
A
V
20a
INNER
PERIPHERAL SIDE
C
13a
14a
12a
4/5×V
21a
11a
12a
22a
13b
21b
14b
12b
3/5×V
12b
11b
22b
13c
14c
12c
2/5×V
21c
12c
11c
22c
13d
21d
14d
12d
1/5×V
12d
11d
3a
22d
12e
21e
OUTER
PERIPHERAL SIDE
0
0
10b
w
B'
20b
A'
C'

A
A'
VS
GND
GND
p+
p+
p
p
p
p
n
n
30
31
32
33
34
36
37
38
39
4
41
42
43
44
45
46
11a
11b
11c
11d
21a
21b
21c
21d
21e

A
A'
VS
VB
GND
GND
41
42
40
43
44
45
46
36
37
35
38
39
34
30
31
32
33
4
p+
n+
p
n
11a
11b
11c
11d
21a
21b
21c
21d
21e

B'
B
GND
VS
GND
p+
38
34
30
p
p
42
39
4
13e
31
12e
11d
13d
12d
11c
13c
12c
n
p
11b
13b
12b
11a
13a
12a
33
46
45
37
p+
n
32
41
44
p
43
36

D'
GND
42
p+
38
34
30
p
GND
4
39
31
51f
11d
52e
51e
52d
11c
51d
n
p
52c
11b
51c
33
52b
11a
51b
52a
46
D
41
45
37
VS
p+
n
32
44
p
43
36

E'
E
GND
VS
GND
p+
p
n
38
34
30
42
4
31
52e
52d
52c
52b
52a
51f
51e
51d
51c
51b
11d
11c
11b
11a
33
32
46
41
45
44
43
36
37

3b(3)
1
16
2
3a(3)
20a
10
10b
20
20b
5

G
V
20a
21a
16a
22a
21b
16b
21c
22b
16c
22c
21d
16d
16e
21e
22d
10b
20b
G'

X'
X
30
73
p+
74
76
72
p+
75
p+
39
38
17
11d
11c
21e
21d
n
p
p
n
p
71
31
34
GND
4
33
46
45
44
43

220
221
223
222
Vdc
OUT
213
E1
233
VB
234
VS
91a
5
214
DRIVER CIRCUIT
FROM COMPARATOR
201
HIGH-SIDE DRIVE CIRCUIT
91
91b
200
92
92a
207
231
205
206
GND
202
LOW-SIDE DRIVE CIRCUIT
CONTROL CIRCUIT
203
204
REFERENCE VOLTAGE
212
Vcc
232
CONTROL SIGNAL IN
TO DRIVER CIRCUIT
211
GND

Vdc
220
221
OUT
223
222
213
E1
214
DRIVER CIRCUIT
FROM COMPARATOR
233
VB
234
VS
91a
5
201
HIGH-SIDE DRIVE CIRCUIT
91
91b
92
92a
93
93a
210
207
GND
205
206
231
203
202
LOW-SIDE DRIVE CIRCUIT
CONTROL CIRCUIT
204
Vcc
212
232
211
CONTROL SIGNAL IN
TO DRIVER CIRCUIT
GND

H'
H
GND
VB
VS
42
40
46
45
41
44
43
36
312
311
(311c)
321
312
p+
38
34
30
p
p
GND
39
4
31
n
p
33
35
n+
32
n
37
p+
p

H
H'
VS
VB
GND
GND
41
46
40
42
43
44
45
312
311
(311c)
312
321
36
32
334
37
35
39
38
34
30
332
4
331
333
p
p+
n
n+
n-
p
p+
p
p
n

H
H'
VS
VB
GND
GND
41
42
43
44
45
46
40
35
37
36
32
334
38
34
30
39
4
331
341
321
311
(311c)
312
312
p+
n+
p+
p
p
p
n
n
n-
p

H'
H
GND
VB
VS
42
40
46
45
41
44
43
36
334
312
311
(311c)
321
342
331
4
39
38
34
30
p+
n+
35
37
p
n
GND

SEMICONDUCTOR DEVICE

CROSS REFERENCE TO RELATED APPLICATIONS

This application is based upon and claims the benefit of priority of the prior Japanese Patent Application No. 2015-244684, filed on Dec. 15, 2015, and No. 2016-196812, filed on Oct. 4, 2016, the entire contents of which are incorporated herein by reference.

BACKGROUND OF THE INVENTION

1. Field of the Invention

The embodiments discussed herein relate to a semiconductor device.

2. Description of the Related Art

Conventionally, to stably secure a high breakdown voltage, a field plate (FP) is often included in an edge termination structure portion of a high voltage diode, a high voltage metal oxide semiconductor field effect transistor (MOSFET), and the like. A resistive field plate (RFP) and a multiple floating field plate (MFFP) are known as field plate structures.

The resistive field plate includes a thin-film resistive layer provided in a spiral planar layout that surrounds the periphery of a high-potential-side region to span from the high potential side (high side) region to a low potential side (low side) region, and the surface potential thereof is controlled using resistance division (see Japanese Laid-Open Patent Publication Nos. 2000-022175 and 2003-008009, International Patent Publication No. 2003-533886, Japanese Laid-Open Patent Publication No. 2000-252426, and Japanese Patent Publication No. 5748353). The multiple floating field plate includes floating coupled capacitance between metal layers provided in a planar layout of concentric circles surrounding the periphery of the high-potential-side region and in multiple layers (multi-ply) through an interlayer insulating film, and the surface potential thereof is controlled using serial junctions of capacitance. In particular, the resistive field plate has a strong compelling force for the surface potential compared to that of the capacitance-coupling multiple floating field plate and is useful for securing a high breakdown voltage.

Even in a case where the resistive field plate includes one spiral thin-film resistive layer, when the thin-film resistive layer is provided to spread in the edge termination structure portion, the intensity of the electric field of the edge termination structure portion is in principle maintained to be uniform by the resistive field plate. When the surface area of the edge termination structure portion is large, etc., the resistance value of the overall resistive field plate may become excessively high. A merit is that current consumption decreases as the resistance value of the overall resistive field plate increases while a demerit is that, when the resistance value of the overall resistive field plate is excessively high, substantially no current flows through the resistive field plate and the compelling force for the surface potential is lost.

When compelling force for the surface potential by the resistive field plate cannot be obtained, for example, mobile ions trapped (captured) in the interlayer insulating film adversely affect the electric field distribution, making uniform electric field distribution difficult to be maintained in the edge termination structure portion. When the thin-film resistive layer constituting the resistive field plate is formed by polysilicon (poly-Si) or the like, the resistance of the resistive field plate may be reduced by increasing the dose amount of the impurity in the polysilicon. This increase of the dose amount of the impurity in the polysilicon is however not practical in cases where a thin-film resistive layer constituting the resistive field plate and the constituent units each including polysilicon in other circuit regions are concurrently formed.

The configuration of a conventional resistive field plate will be described. FIGS. 17, 18A, 18B, and 19 are plan diagrams of the planar layout of a conventional resistive field plate. In FIGS. 17 to 19, the same constituent units are denoted by the same reference numerals. FIG. 17 is "FIG. 6 in Japanese Laid-Open Patent Publication No. 2000-022175". The resistive field plate depicted in FIG. 17 includes two thin-film resistive layers 103*a* and 103*b* that are provided each in a spiral planar layout surrounding a high-potential-side region 101, from the high-potential-side region 101 to a low-potential-side region 102, and that are provided not to intersect each other. Compared to a case where one thin-film resistive layer having an equal overall length is used, the overall length of each single layer of the thin-film resistive layers 103*a* and 103*b* is shorter and the surface potential is controlled by the combined resistance thereof.

FIGS. 18A and 18B are "FIG. 1 in Japanese Laid-Open Patent Publication No. 2003-008009". The depicted resistive field plate includes plural metal layers 113 provided in a planar layout of concentric circles surrounding a high-potential-side region 101, and thin-film resistive layers 114 that each electrically connects the adjacent metal layers 113. A reference numeral "112" denotes a contact (a connecting portion) between the metal layer 113 and the thin-film resistive layer 114. The convenience of the layout is enhanced by providing the metal layers 113 in multiple layers on the thin-film resistive layer 114 through an interlayer insulating film 115. In addition, the length of the thin-film resistive layer 114 is increased to reduce the sheet resistance of the thin-film resistive layer 114 by providing the thin-film resistive layer 114 in a planar layout on a straight line oblique to the orientation of the periphery of the metal layer 113 (FIG. 18B).

FIG. 19 is "FIG. 11 in International Patent Publication No. 2003-533886". The resistive field plate depicted in FIG. 19 has the ends thereof positioned on the side of a high-potential-side region 101 and on the side of a low-potential-side region 102, and includes two thin-film resistive layers 123*a* and 123*b* each provided in a meandering planar layout. The ends of the thin-film resistive layers 123*a* and 123*b* in the high-potential-side region 101 are electrically connected to another thin-film resistive layer 124 provided in the high-potential-side region 101. Reference numerals "126*a*" and "126*b*" respectively denote metal wires that electrically connect ends on the side of the high-potential-side region 101 of the thin-film resistive layers 123*a* and 123*b* to the other thin-film resistive layer 124. Reference numerals "127*a*" and "127*b*" denote metal wires that respectively connect ends on the side of the low-potential-side region 102 of the thin-film resistive layers 123*a* and 123*b* to a control/evaluating circuit 128.

In the resistive field plate depicted in FIG. 19, the resistance value is reduced to be low compared to that in a case where the thin-film resistive layer is provided in one spiral planar layout, by realizing the function of the resistive field plate using the thin-film resistive layers 123*a*, 123*b*, and 124. The thin-film resistive layers 123*a* and 123*b* are provided for protruded portions thereof formed corresponding to the meandering cycle to face each other, and a peak of the intensity of the electric field or increase of the electric field is prevented near the protruded portions (hereinafter, each referred to as "protruded portion on the outer side") on the side not to facing each other. The protruded portions on the outer side of each of the thin-film resistive layers 123*a* and 123*b* are connected to each other by a polysilicon tape 125 that surrounds the periphery of the high-potential-side region 101, and the polysilicon tape 125 stabilizes the surface potential.

Japanese Laid-Open Patent Publication No. 2000-252426 discloses a resistive field plate that has a configuration having one thin-film resistive layer provided in a planar layout to meander on a field insulating film covering a field limiting ring (FLR). In Japanese Laid-Open Patent Publication No. 2000-252426, the electric field applied to the field insulating film is mitigated by substantially equalizing the electric field applied to the field limiting ring and the electric field applied to the resistive field plate.

Japanese Patent Publication No. 5748353 discloses a resistive field plate that has a configuration formed by dividing an edge termination structure portion into plural sections and providing different thin-film resistive layers each in a meandering planar layout on a divided section. In Japanese Patent Publication No. 5748353, the edge termination structure portion is provided in a planar layout having a shape including straight line-like portions facing each other and arch portions connecting the ends of the straight line-like portions with each other at the ends thereof. The resistance value of the overall resistive field plate is reduced by providing different thin-film resistive layers on the straight line-like portions having different lengths in the radial direction and the arch portions.

SUMMARY OF THE INVENTION

A semiconductor device according to one aspect of the present invention includes a first resistive element formed in an insulating film on a semiconductor substrate; and a second resistive element formed in the insulating film. The second resistive element faces the first resistive element in a depth direction with the insulating film therebetween. The first resistive element has a first portion that in a first region of the first resistive element, is of a different level and material and that is connected to a second portion of the first resistive element in a second region exclusive of the first region. The second resistive element faces the first portion of the first resistive element in the depth direction.

In the semiconductor device, a conductive film layer is formed in the first region of the first resistive element, and a thin-film resistive layer is provided in the second region.

The semiconductor device further includes a second semiconductor region provided in the semiconductor substrate and having a potential fixed to be lower than that of a first semiconductor region; and an edge termination region that is provided between the first semiconductor region and the second semiconductor region. The edge termination region electrically separates the first semiconductor region and the second semiconductor region from each other. The first resistive element is formed in a spiral planar layout, surrounding a periphery of the first semiconductor region in the edge termination region.

In the semiconductor device, the second resistive element is provided in a meandering planar layout.

In the semiconductor device, the second resistive element is provided in a spiral planar layout having a number of turns different from that of the first resistive element.

In the semiconductor device, the second resistive element is provided in a meandering planar layout, and turnaround points of the meandering pattern of the second resistive element are each positioned at a center between adjacent spiral wires of the first resistive element.

In the semiconductor device, the second resistive element is provided in a meandering planar layout, and turnaround points of the meandering pattern of the second resistive element are positioned on spiral wires of the first resistive element.

In the semiconductor device, the second resistive element is a thin-film resistive layer.

In the semiconductor device, the second resistive element is provided in a level same as that of the second portion of the first resistive element.

In the semiconductor device, the second resistive element is provided in a level different from that of the first resistive element.

In the semiconductor device, the second resistive element is provided in a meandering planar layout. The second resistive element has thin-film resistive layers and conductive film layers alternately provided therein each sandwiching a turnaround point of the meandering pattern.

In the semiconductor device, the first resistive element and the second resistive element each have ends positioned in the first semiconductor region and the second semiconductor region.

A semiconductor device according to another aspect of the invention includes a second semiconductor region provided in a semiconductor substrate and having a potential fixed to be lower than that of a first semiconductor region; an edge termination region provided between the first semiconductor region and the second semiconductor region, the edge termination region electrically separating the first semiconductor region and the second semiconductor region from each other; a first resistive element formed in a spiral planar layout, surrounding a periphery of the first semiconductor region in the edge termination region; and a second resistive element facing a first portion of the first resistive element in a depth direction and sandwiching an insulating film therebetween, the second resistive element being formed in one of a meandering planar layout and a spiral planar layout having a number of turns different from that of the first resistive element.

In the semiconductor device, the first resistive element is a thin-film resistive layer.

In the semiconductor device, the first resistive element includes a conductive film layer provided in the first portion thereof and a thin-film resistive layer in a second portion exclusive of the first portion.

In the semiconductor device, the second resistive element is provided in a meandering planar layout, and turnaround points of the meandering pattern of the second resistive element are each positioned at a center between adjacent spiral wires of the first resistive element.

In the semiconductor device, the second resistive element is provided in a meandering planar layout, and turnaround points of the meandering pattern of the second resistive element are positioned on spiral wires of the first resistive element.

In the semiconductor device, the second resistive element is a thin-film resistive layer.

In the semiconductor device, the second resistive element is provided in a level same as that of a second portion of the first resistive element exclusive of the first portion of the first resistive element.

In the semiconductor device, the second resistive element is provided in a level different from that of the first resistive element.

In the semiconductor device, the second resistive element is provided in a meandering planar layout, and the second resistive element has thin-film resistive layers and conductive film layers alternately provided therein each sandwiching a turnaround point of the meandering pattern.

In the semiconductor device, the first resistive element and the second resistive element each have ends positioned in the first semiconductor region and the second semiconductor region.

Objects, features, and advantages of the present invention are specifically set forth in or will become apparent from the following detailed description of the invention when read in conjunction with the accompanying drawings.

DETAILED DESCRIPTION OF THE INVENTION

Figure 1A:
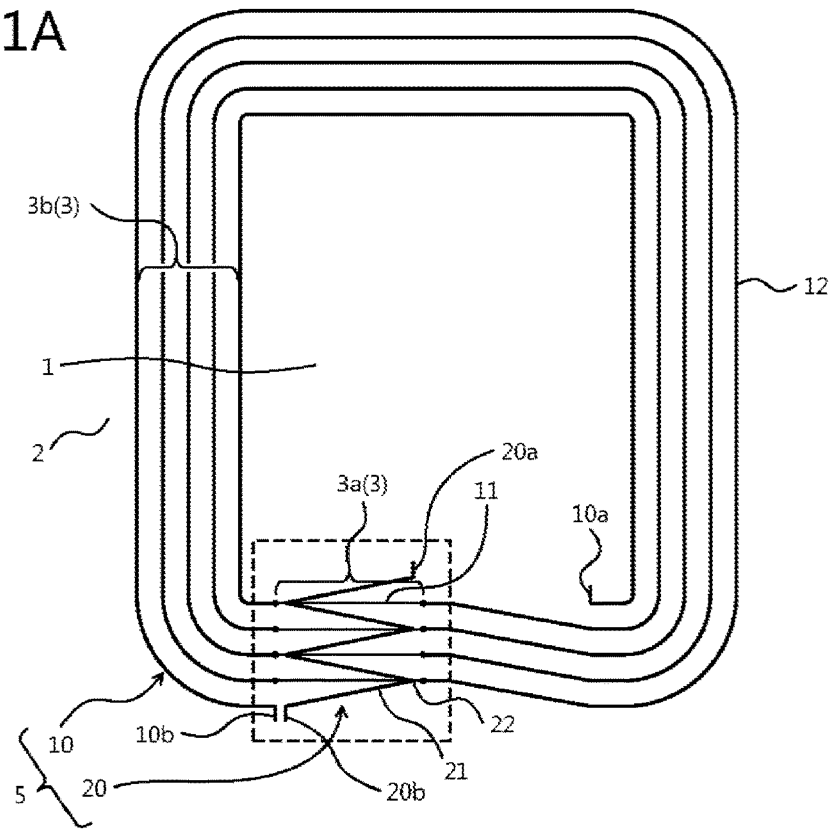
FIGS. 1A and 1B are plan diagrams of a planar layout of an edge termination structure of a semiconductor device according to a first embodiment.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

Figure 1B:
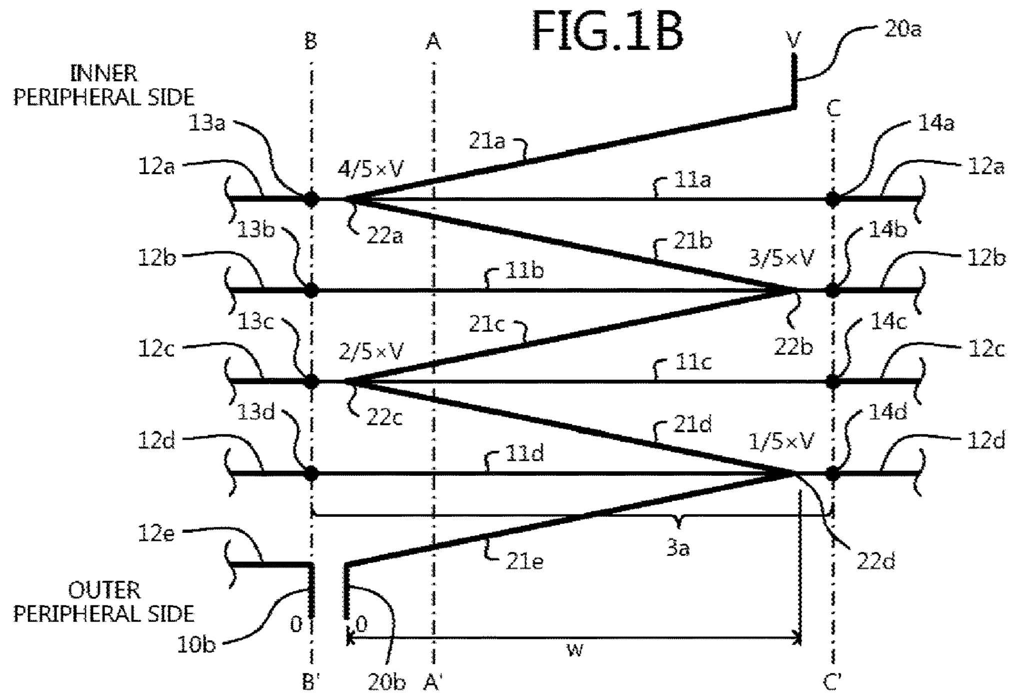

A structure of the semiconductor device according to a first embodiment will be described. FIGS. 1A and 1B are plan diagrams of a planar layout of an edge termination structure of the semiconductor device according to the first embodiment. FIG. 1A depicts a planar layout of an overall resistive field plate (RFP) 5 and FIG. 1B is an enlarged view of a portion surrounded by a dotted line rectangular frame of the resistive field plate 5 in an enlarged manner (similarly for FIGS. 6A, 6B, 9A, 9B, 10A, and 10B). The description will be made taking an example of a case where a portion of the resistive field plate 5 is used as a voltage detection resistor. The semiconductor device according to the first embodiment depicted in FIGS. 1A and 1B includes the resistive field plate 5 provided to surround a high-potential-side (high side) region 1, at an edge termination structure portion 3 between the high-potential-side region 1 and a low-potential-side (low side) region 2.

The high-potential-side region 1 is formed in, for example, a substantially rectangular planar layout. The high-potential-side region 1 has a high-side circuit portion (not depicted) and the like provided therein. The high-side circuit portion is, for example, a complementary MOS (CMOS) circuit that operates using as a reference potential an emitter potential VS of an insulated gate bipolar transistor (IGBT) on the high potential side (hereinafter, referred to as "upper arm IGBT") of two IGBTs connected in series to each other constituting a portion of one phase of a half bridge circuit to be an output stage, and that drives the upper arm IGBT. The high-potential-side region 1 is electrically connected to a power source potential VB that is the highest potential of the high-side circuit portion.

In the low-potential-side region 2, for example, a low-side circuit portion (not depicted) and the like in FIG. 1 are formed. The low-side circuit portion operates using a ground potential GND as a reference potential, and is a CMOS circuit that drives an n channel type MOSFET of a level shift circuit for increasing the level. The low-potential-side region 2 is fixed at, for example, the ground potential GND, which is the minimum potential. The edge termination structure portion 3 is arranged between the high-potential-side region 1 and the low-potential-side region 2, for example, in planar layout of a substantially rectangular frame shape. The edge termination structure portion 3 is configured by a parasitic diode 4 described hereinafter, and electrically separates the high-potential-side region 1 and the low-potential-side region 2. In the edge termination structure portion 3, for example, the resistive field plate 5 may be arranged so as to spread throughout the edge termination structure portion 3.

The resistive field plate 5 is made up of two resistive elements 10, 20. The resistive element 10 (hereinafter, spiral resistive element) is arranged in a spiral-shaped planar layout so as to surround a periphery of the high-potential-side region 1, from the high-potential-side region 1 side (inner peripheral side) to the low-potential-side region 2 side (outer peripheral side). The spiral resistive element 10 has a function of fixing a surface electrode of the edge termination structure portion 3 and maintaining uniformity of the electric field strength of the edge termination structure portion 3. The spiral line of the spiral resistive element 10, for example, may be substantially the same width and arranged at substantially equal intervals. The reason for this is that the potential difference between spiral lines of the spiral resistive element 10 becomes equal, enabling the electric field strength of the edge termination structure portion 3 to be maintained uniform and easy design of the resistive elements 20, 70. The spiral resistive element 10, at a portion of the edge termination structure portion 3 (hereinafter, first edge termination region) 3*a*, is made up of a material and level different from another portion (hereinafter, second edge termination region) 3*b*.

In particular, the spiral resistive element 10 has in the first edge termination region 3*a*, for example, conductive film layers 11 formed of a conductive material such as metal, and in the second edge termination region 3*b*, for example, has a thin-film resistive layers 12 formed of a resistive material such as impurity-dosed poly-silicon (poly-Si). The conductive film layers 11 and the thin-film resistive layers 12 forming the spiral resistive element 10 are coupled via a contact portion penetrating an interlayer insulating film (not depicted). FIGS. 1A and 1B depict the conductive film layers 11 by a thinner line than the thin-film resistive layers 12. The thin-film resistive layers 12 is arranged concentrically to surround the periphery of the high-potential-side region 1 and to form a substantially rectangular planar shape open at the first edge termination region 3*a*. The conductive film layers 11 are electrically connected on a level different from the thin-film resistive layers 12 to the respective thin-film resistive layers 12, thereby forming portions of spiral lines of the spiral resistive element 10. Therefore, the conductive film layers 11 are arranged in a stripe-shaped planar layout along the peripheral orientation of the thin-film resistive layers 12.

In this case, for example, it is assumed that the number of the spiral wires of the spiral resistive element 10 (the number of turns of the spiral wire) is set to be five and the thin-film resistive layers 12 constituting the spiral wires are assumed as a "first thin-film resistive layer 12*a*" to a "fifth thin-film resistive layer 12*e*" sequentially from the inner peripheral side to the outer peripheral side. The four straight line-shaped conductive film layers 11 provided in a stripe-like planar layout are assumed as a "first conductive film layer 11*a*" to a "fourth conductive film layer 11*d*" sequentially from the inner peripheral side to the outer peripheral side. Contact portions for ends of the conductive film layers 11 and the thin-film resistive layers 12 are referred to as "first" to "fourth", sequentially from the inner peripheral side to the outer peripheral side and are denoted by reference numerals "13*a*" to "13*d*". Contact portions for the other ends of the conductive film layers 11 and the thin-film resistive layers 12 are referred to as "fifth" to "eighth", sequentially from the inner peripheral side to the outer peripheral side, and are denoted by reference numerals "14*a*" to "14*d*". The other end of each of the conductive film layers 11 may be connected to an end of each of the thin-film resistive layers 12 (12*b* to 12*e*) adjacent thereto on the outer peripheral side. An open end (inner-peripheral end portion) of the innermost first thin-film resistive layer 12*a* and an open end (outer-peripheral end portion) of the outermost fifth thin-film resistive layer 12*e* are an inner-peripheral end 10*a* and an outer-peripheral end 10*b*, respectively, of the spiral resistive element 10.

The conductivity of the conductive film layer 11 in the spiral resistive element 10, arranged in the first edge termination region 3*a* is such that the voltage substantially does not drop. Therefore, as described hereinafter, even when the resistive element 20 is formed in the first edge termination region 3*a* so as to overlap the conductive film layers 11, the potential difference of the resistive element 20 may be prevented from being adversely affected. Additionally, the thin-film resistive layers 12, which are resistivity, arranged in the second edge termination region 3*b* enable the resistance value of the spiral resistive element 10 to be high enough to obtain a compelling force (field plate effect) of the surface electrode of the edge termination structure portion 3. The resistance value of the spiral the resistive element 10 is equal to or greater than the resistance value of the resistive element 20, and is changed variously in a range enabling the field plate effect to be established.

The ratio of the second edge termination region 3*b* in which the thin-film resistive layers 12 of the spiral resistive element 10 are arranged is also changed in a range enabling the field plate effect to be established. Further, respective ends of the spiral resistive element 10 and the resistive element 20 are each electrically connected to the high-potential-side region 1 and the low-potential-side region 2. The potential difference of the high-potential-side region 1 and the low-potential-side region 2 is, for example, 200 V or higher, and therefore, for example, when the thin-film resistive layers 12 of the spiral resistive element 10 and the resistive element 20 are a conductive film layer, the resistance value may become too low whereby the high-potential-side region 1 and the low-potential-side region 2 may short-circuit. Therefore, the thin-film resistive layers 12 of the spiral resistive element 10 and the resistive element 20 may be formed by a material having a low conductivity.

The other resistive element (hereinafter referred to as meander resistive element) 20 is formed on a level different from the conductive film layers 11 of the spiral resistive element 10 in the first edge termination region 3*a* and faces the conductive film layers 11 in a depth direction across an interlayer insulating film (not depicted). The meander resistive element 20 may be formed on the same level as the thin-film resistive layers 12 of the spiral resistive element 10. The meander resistive element 20 has respective ends electrically connected to the high-potential region 1 and the low-potential region 42 and are arranged in a planar layout to meander in a lightning shape or sawtooth shape, for example. Meandering in a lightning shape means meandering to form an acute angle at turnaround points so as to form a zigzag-shaped pattern such that segments (hereinafter referred to as linear portions, assigned reference characters 21*a* to 21*e*, sequentially from the inner peripheral side toward the outer peripheral side) connecting the turnaround points (acute apexes) are arranged obliquely to the conductive film layers 11. The number of turns of the meander patterns of the meander resistive element 20 may be the same as the number of the conductive film layers 11.

The resistance value of the meander resistive element 20 is determined according to a response time when a predetermined voltage value is detected, for example. The resistance value of the meander resistive element 20 may be adjusted by a width w of the meander resistive element 20 (length between the turns in a direction parallel to the conductive film layers 11), for example. The resistance value of the meander resistive element 20 may be several MΩ (e.g., about 7 MΩ). The meander resistive element 20 is preferably arranged in a planar layout such that a potential difference ΔV is equal among positions intersecting the conductive film layers 11 of the spiral resistive element 10 (in this example, turnaround points 22 of the meander patterns). As a result, local concentrations of electric fields may be avoided on the meander resistive element 20. This planar layout of the meander resistive element 20 avoiding the local electric field concentrations may be designed easily by making the number of turns of the meander patterns of the meander resistive element 20 the same as the number of the conductive film layers 11. If the number of turns of the meander pattern of the meander resistive element 20 is four and the same as the number of the conductive film layers 11 and the turnaround points of the meander pattern (respectively referred to as first to fourth turnaround points 22*a* to 22*d* sequentially from inside to outside) are respectively located on the first to fourth conductive film layers 11*a* to 11*d*, the potential distribution of the meander resistive element 20 is as follows.

The potential of an inner-side end portion 20*a* is the maximum potential applied to the meander resistive element 20 and is set to be the same potential V [V: volt] as the potential of the inner-peripheral end 10*a* of the spiral resistive element 10. Additionally, the potential of an outer-side end portion 20*b* is the minimum potential applied to the meander resistive element 20 and is set to be the same 0 [V] as the potential of the outer-peripheral end 10*b* of the spiral resistive element 10. In the spiral resistive element 10, the potential of the first conductive film layer 11*a* that is innermost and the first thin-film resistive layer 12*a* is ⅘ (=⅘×V[V]) of the potential V [V] of the inner-peripheral end 10*a* of the spiral resistive element 10. The potential of the second conductive film layer lib and the second thin-film resistive layer 12*b* is ⅗ (=⅗×V[V]) of the potential V [V] of the inner-peripheral end 10*a* of the spiral resistive element 10. The potential of the third conductive film layer 11*c* and the third thin-film resistive layer 12*c* is ⅖ (=⅖×V[V]) of the potential V [V] of the inner-peripheral end 10*a* of the spiral resistive element 10. The potential of the fourth conductive film layer 11*d* and the fourth thin-film resistive layer 12*d* is ⅕ (=⅕×V[V]) of the potential V [V] of the inner-peripheral end 10*a* of the spiral resistive element 10. In other words, the potential difference between spiral lines of the spiral resistive element 10 is ⅕×V [V].

On the other hand, the potential of the innermost first turnaround point 22*a* of the meander resistive element 20 is ⅘ (=⅘×V[V]) of the potential V [V] of the inner-side end portion 20*a* of the meander resistive element 20, equal to the potential of the first conductive film layer 11*a* of the spiral resistive element 10. The potential of the second turnaround point 22*b* of the resistive element 20 is ⅗ (=⅗×V[V]) of the potential V [V] of the inner-side end portion 20*a* of the meander resistive element 20, equal to the potential of the second conductive film layer 11*b* of the spiral resistive element 10. The potential of the third turnaround point 22*c* of the meander resistive element 20 is ⅖ (=⅖×V[V]) of the potential V [V] of the inner-side end portion 20*a* of the meander resistive element 20, equal to the potential of the third conductive film layer 11*c* of the spiral resistive element 10. The potential of the outermost fourth turnaround point 22*d* of the meander resistive element 20 is ⅕ (=⅕×V[V]) of the potential V [V] of the inner-side end portion 20*a* of the meander resistive element 20, equal to the potential of the fourth conductive film layer 11*d* of the spiral resistive element 10. In other words, the potential difference ΔV between the conductive film layers 11 of the spiral resistive element 10 is ⅕×V[V]. Thus, consistency of the potential distribution of the spiral resistive element 10 and the meander resistive element 20 may be obtained easily.

Figure 2:
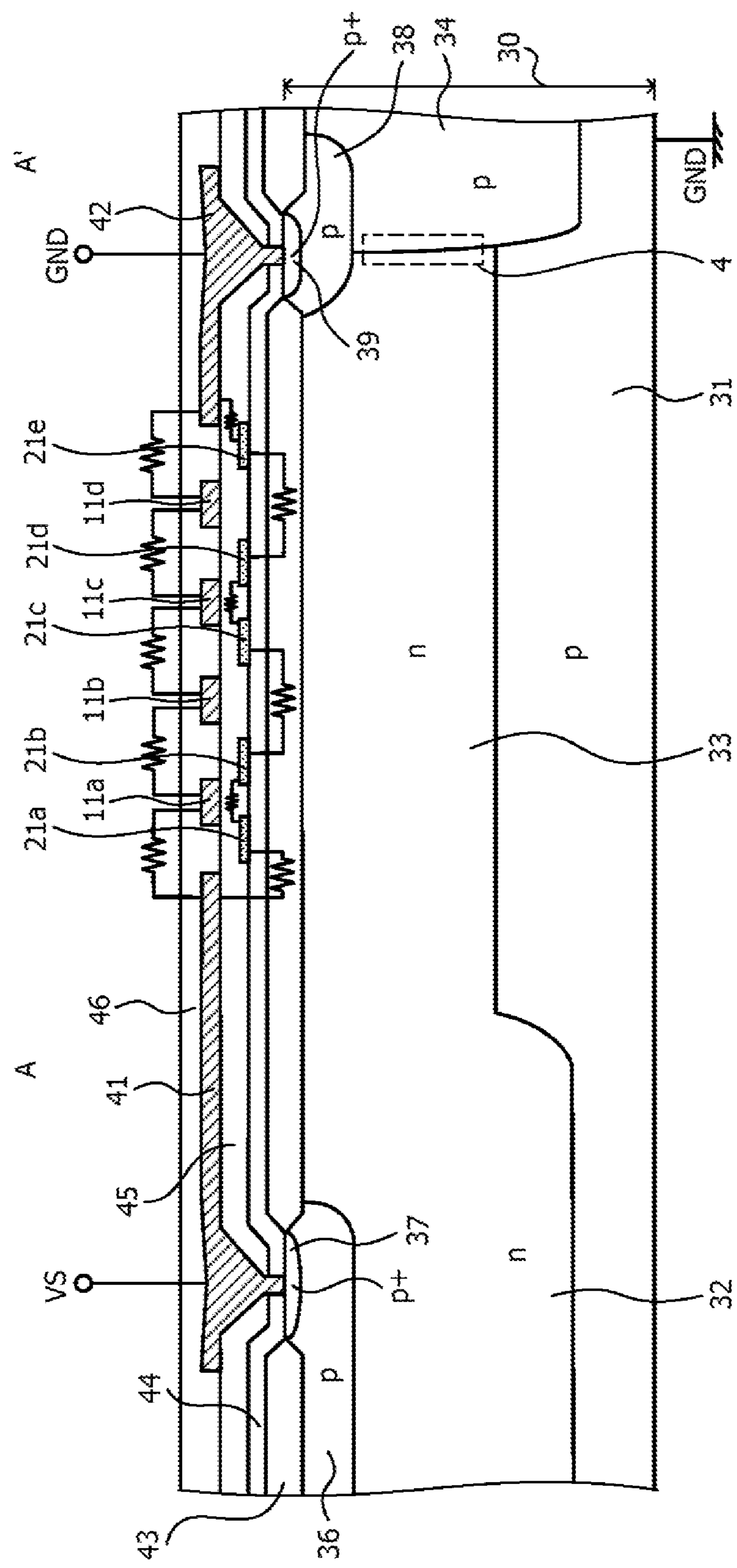
FIG. 2 is a cross-sectional view of a structure along cutting line A-A' in FIG. 1B.
Figure 3:
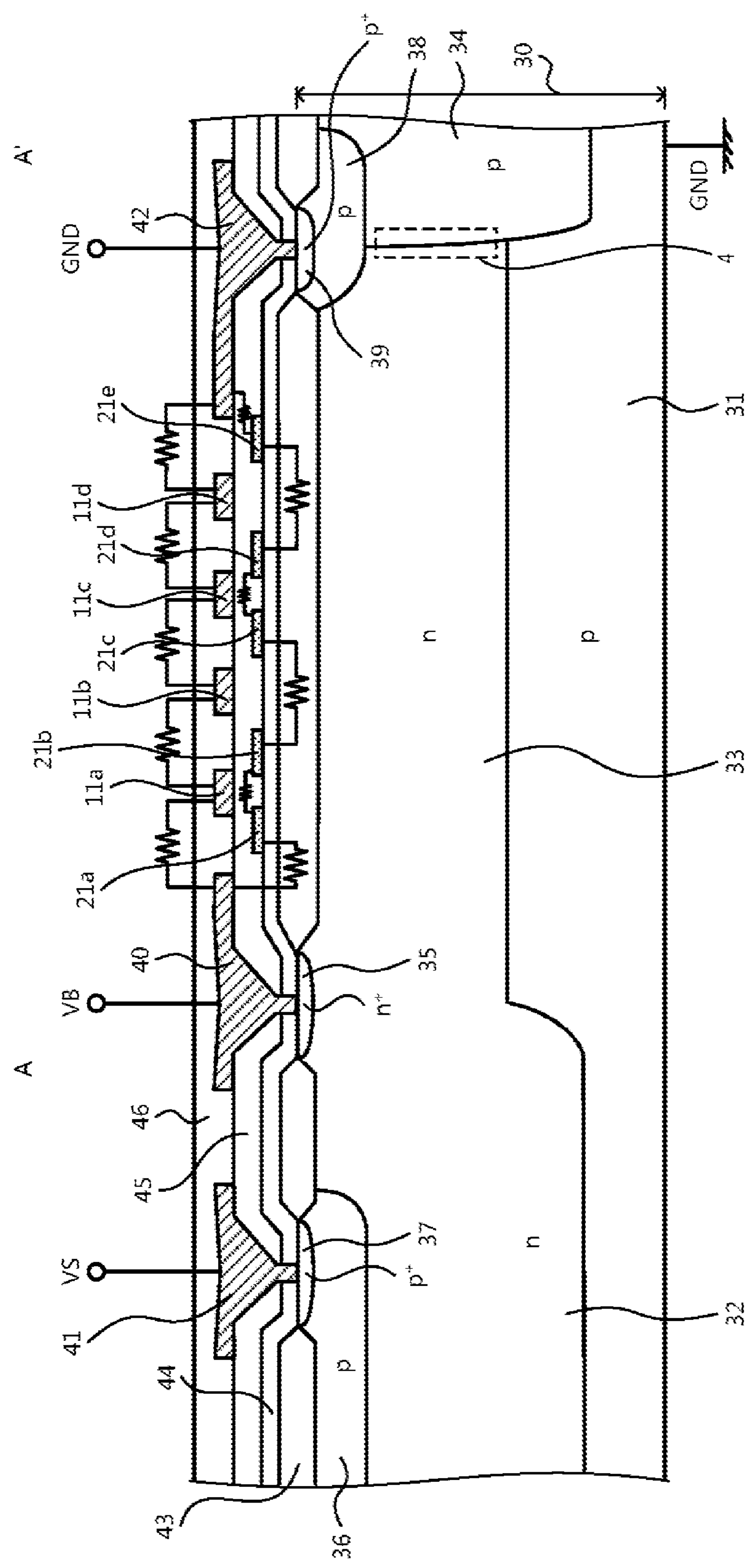
FIG. 3 is a cross-sectional view of another example of the structure along cutting line A-A' in FIG. 1B.
Figure 4:
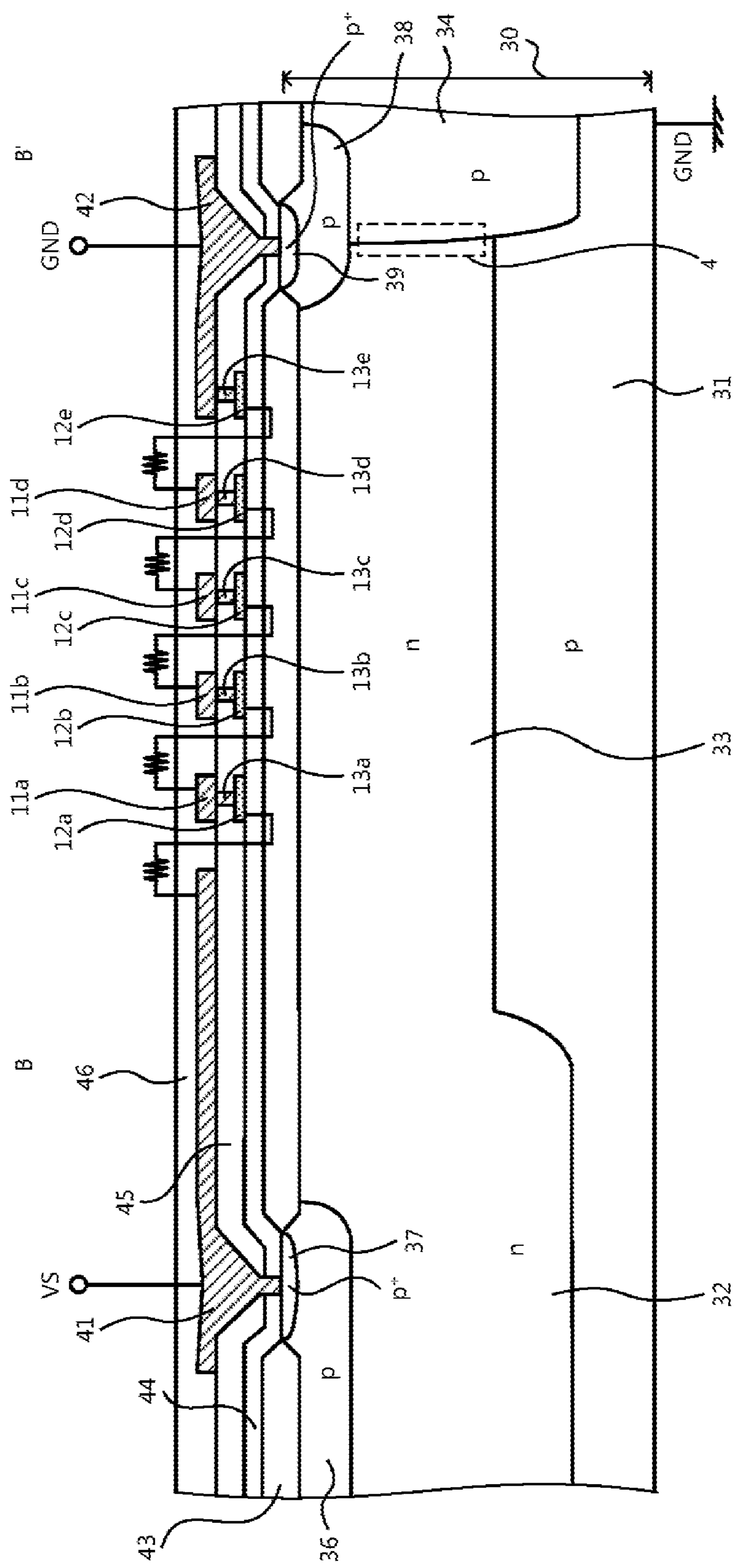
FIG. 4 is a cross-sectional view of the structure along cutting line B-B' in FIG. 1B.

A cross-sectional of a structure of the semiconductor device according to the first embodiment will be described. FIG. 2 is a cross-sectional view of the structure along cutting line A-A' in FIG. 1B. FIG. 3 is a cross-sectional view of another example of the structure along cutting line A-A' in FIG. 1B. FIG. 4 is a cross-sectional view of the structure along cutting line B-B' in FIG. 1B. As depicted in FIGS. 2 and 4, in a surface layer of the front surface of the p-type semiconductor substrate 30, an n-type diffusion region 32, an n-type diffusion region 33, and a p-type diffusion region 34 are selectively formed. A p-type region 31 on the substrate back surface side is fixed at the ground potential GND, which is the minimum potential, for example. The p-type region 31 on the substrate back surface side is a portion of the p-type semiconductor substrate 30 remaining as a p-type region by not forming these regions at a portion deeper from the substrate front surface than the n-type diffusion regions 32, 33, and the p-type diffusion region 34.

The n-type diffusion region 32 makes up the high-potential-side region 1. In the n-type diffusion region 32, for example, a horizontal-type p-channel MOSFET of the high-side circuit portion (CMOS circuit complimentary connecting a horizontal n channel MOSFET and a horizontal p channel MOSFET) is provided. Further, in a p-type region 36 formed in the n-type diffusion region 32, for example, a horizontal-type n-channel MOSFET of the high-side circuit portion is formed. The n-type diffusion region 33 is arranged farther on the outer side than the n-type diffusion region 32 and contacts the n-type diffusion region 32. The depth of the n-type diffusion region 33, for example, is shallower than the n-type diffusion region 32. The p-type diffusion region 34 is arranged farther on the outer side than the n-type diffusion region 33 and contacts the n-type diffusion region 33. In the p-type diffusion region 34, for example, a p-type region 38 is formed so as to extend farther than the p-type diffusion region 34 towards a center of the n-type diffusion region 33.

At a pn junction between the p-type diffusion region 34 and the n-type diffusion region 33, the parasitic diode 4 is formed and the high-potential-side region 1 and the low-potential-side region 2 are electrically separated by the parasitic diode 4. The n-type diffusion region 33 constitutes the edge termination structure portion 3 that has the resistive field plate 5 (see FIGS. 1A and 1B) provided therein. The n-type diffusion region 33 is a region in which a large part of the depletion layer spreads when a reverse bias is applied to the parasitic diode 4, and this region is referred to as "edge termination region". The p-type diffusion region 34 is a region that constitutes the lower potential side region 2. In other words, an $n^+$-type region 35 formed in the n-type diffusion region 32 functions as a cathode region of the parasitic diode 4 and a $p^+$-type region 39 formed in the p-type region 88 functions as an anode region of the parasitic diode 4. The low-potential-side region 2 is made up of an n-type diffusion region (not depicted) arranged by the p-type diffusion region 34. The p-type diffusion region 34 may be a portion of the p-type semiconductor substrate 30 remaining in a striped shape so as to be exposed from the p-type region 31 of the substrate back surface side to the substrate front surface. Exposure at the substrate front surface is arrangement such so as to contact a first insulating film 43 described hereinafter.

A first electrode 40 is electrically connected to the n-type diffusion region 32 through the $n^+$-type region 35. The first electrode 40 is fixed at the power source potential VB of the high-side circuit portion. A second electrode 41 is electrically connected to the p-type region 36 through a $p^+$-type region 87 formed in the p-type region 36. The second electrode 41 is fixed at the reference potential (the emitter potential VS of the IGBT of the upper arm) of the high-side circuit portion. A third electrode 42 is fixed at the ground potential GND, which is the minimum potential, for example.

On the front surface of the p-type semiconductor substrate 30, portions other than contacts of semiconductor portions and the first to third electrodes 40 to 42 are covered by an insulating layer formed by sequentially stacking the first insulating film 43, a second insulating film 44, and an interlayer insulating film 45. The first insulating film 43, for example, is Local Oxidation of Silicon (LOCOS). The first to third electrodes 40 to 42 respectively extend on the interlayer insulating film 45. The first to third electrodes 40 to 42, the interlayer insulating film 45, and the conductive film layers 11 of the spiral resistive element 10 described hereinafter, for example, are covered by an interlayer insulating film 46.

As depicted in FIG. 3, straight line portions (hereinafter, each referred to as "thin-film resistive straight line portion") 21*a* to 21*e* of the meandering pattern of the meander resistive element 20 are formed in the interlayer insulating film 45 that covers the n-type diffusion region 33 between the $n^+$-type region 35 and the $p^+$-type region 39. Conductive film layers 11 (11*a* to 11*d*) of the spiral resistive element 10 are formed in the interlayer insulating film 46 in a portion (the first edge termination structure portion 3*a*) in which the meander resistive element 20 is formed. In the first edge termination structure portion 3*a* (a cross section taken along a cutting line A-A'), a field plate is configured including the meander resistive element 20 as a first layer thereof, and the conductive film layers 11 of the spiral resistive element 10 as a second layer thereof.

When the reference potential of the high-side circuit portion (the emitter potential VS of the upper arm IGBT) is detected by the meander resistive element 20, the conductive film layer 11*a* on the innermost side of the spiral resistive element 10 and the thin-film resistive straight line portion 21*a* on the innermost side of the meander resistive element 20 are electrically connected to the second electrode 41. The conductive film layer 11*d* on the outermost peripheral side of the spiral resistive element 10 and the thin-film resistive straight line portion 21*e* on the outermost side of the meander resistive element 20 are electrically connected to the third electrode 42.

As depicted in FIG. 4, ends of the conductive film layers 11 (11*a* to 11*d*) of the spiral resistive element 10 are respectively connected to the thin-film resistive layers 12 (12*a* to 12*d*) that face the conductive film layers 11 (11*a* to 11*d*) in the depth direction through the first to the fourth contact portions 13*a* to 13*d* penetrating the interlayer insulating film 45. The fifth thin-film resistive layer 12*e* on the outermost peripheral side of the spiral resistive element 10 is connected to the third electrode 42 facing the fifth thin-film resistive layer 12*e* in the depth direction through the fifth contact portion 13*e* penetrating the interlayer insulating film 45. On the border between the first edge termination structure portion 3*a* and the second edge termination structure portion 3*b* (a cross section taken along a cutting line B-B'), a field plate is configured including the thin-film resistive layer 12 of the spiral resistive element 10 as a first layer thereof and the conductive film layers 11 of the spiral resistive element 10 as a second layer thereof.

Although not depicted, a cross-view of the structure taken along a cutting line C-C' passing through the fifth to the eighth contact portions 14*a* to 14*d* for the other ends of the conductive film layers 11 of the spiral resistive element 10 and the thin-film resistive layer 12 also has a field plate configured therein that includes the thin-film resistive layer 12 of the spiral resistive element 10 as a first layer thereof and the conductive film layers 11 of the spiral resistive element 10 as a second layer thereof.

As depicted in FIG. 3, when the power source potential VB of the high-side circuit portion is detected by the meander resistive element 20, the conductive film layer 11*a* on the innermost side of the spiral resistive element 10 and the thin-film resistive straight line portion 21*a* on the innermost side of the meander resistive element 20 only have to be electrically connected to the first electrode 40 instead of the second electrode 42.

Although not depicted, both of such elements may be provided as the meander resistive element 20 to be the voltage detection resistor to detect the emitter potential VS of the upper arm IGBT and the meander resistive element 20 to be the voltage detection resistor to detect the power source potential VB of the high-side circuit portion.

Figure 5:
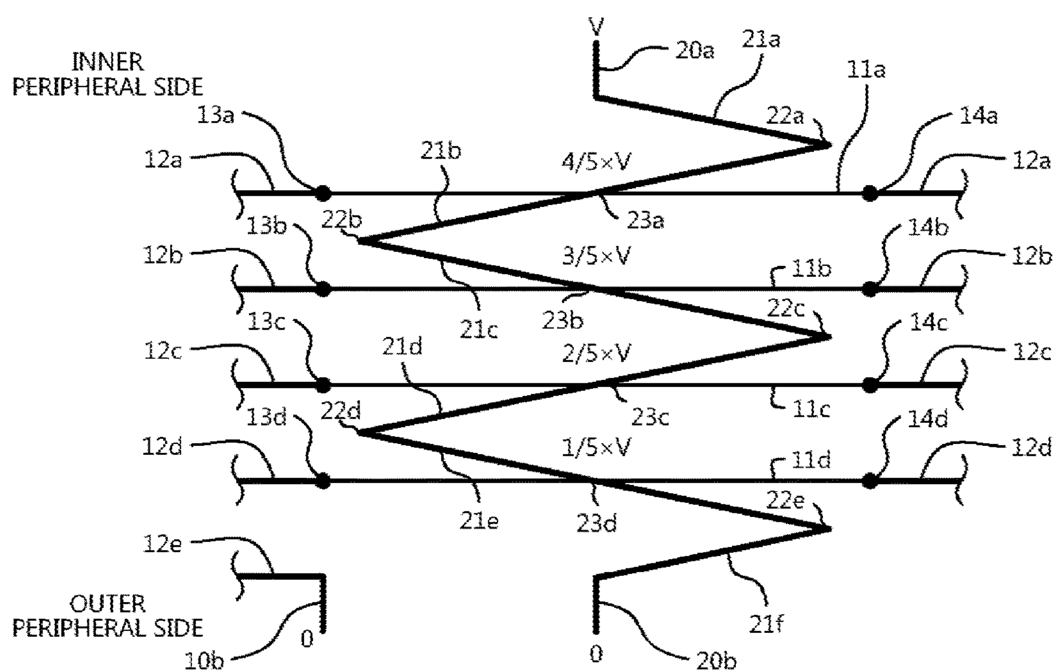
FIG. 5 is a plan diagram of another example of the planar layout of the edge termination structure of the semiconductor device according to the first embodiment.

Another example of the planar layout of the meander resistive element 20 will be described. FIG. 5 is a plan diagram of another example of the planar layout of the edge termination structure of the semiconductor device according to the first embodiment. The semiconductor device according to the first embodiment depicted in FIG. 5 differs from the semiconductor device according to the first embodiment depicted in FIGS. 1A and 1B in that the thin-film resistive straight line portion 21 of the meander resistive element 20 and the conductive film layer 11 of the spiral resistive element 10 intersect each other. In FIG. 5, the thin-film resistive straight line portions of the meandering pattern of the meander resistive element 20 are denoted by reference numerals "21*a*" to "21*f*" sequentially from the inner side to the outer side, and the turnaround points of the meandering pattern are denoted by reference numerals "21*a*" to "22*e*" sequentially from the inner side to the outer side.

In this case, the potentials of the thin-film resistive straight line portions 21*b* to 21*e* of the meandering pattern of the meander resistive element 20 are equal, at intersecting points 23*a* to 23*d* with the conductive film layers 11 (11*a* to 11*d*) of the spiral resistive element 10, to the potentials of the conductive film layers 11 intersecting therewith. Preferably, the potential differences ΔV are set to be equal to each other as much as possible between the turnaround points 22*a* to 22*e* of the meandering pattern of the meander resistive element 20 and the contact portions 13*a* to 13*d* and 14*a* to 14*d* closest to the turnaround points 22*a* to 22*e*. Preferably, the thin-film resistive straight line portions 21*b* to 21*e* of the meandering pattern of the meander resistive element 20 and the conductive film layers 11 (11*a* to 11*d*) of the spiral resistive element 10 intersect each other at their midpoints.

Although not depicted, the number of the turnaround points of the meander resistive element 20 may be different from the number of the conductive film layers 11 of the spiral resistive element 10. In this case, when the number j of the turnaround points of the meander resistive element 20 is an n-fold number (n: a positive integer) of the number i of the conductive film layers 11 of the spiral resistive element 10 (j=i×n), the matching of the potential distribution may be established by the spiral resistive element 10 and the meander resistive element 20.

As described, according to the first embodiment, the thin-film resistive layer provided to face in the depth direction the conductive film layer of the first resistive element sandwiching the insulating film therebetween may be used as the second resistive element by providing the first resistive element formed by replacing a portion of the thin-film resistive layer with a conductive film layer whose level and material are different. The two resistive elements each capable of having conditions independently set therein may thereby be formed being stacked on each other in the up-down direction without increasing the chip area. The first and the second resistive elements each have a function as a field plate having one end thereof connected to the high potential and the other end thereof connected to the low potential. Only one resistive element of the first and the second resistive elements may be used as the voltage detection resistor by reducing the overall length and the total area thereof.

It is assumed that, for example, the first resistive element is the spiral resistive element and the second resistive element is the meander resistive element. In this case, the field plate effect by the spiral resistive element may enable effects of surface charge to be prevented and a predetermined breakdown voltage may be secured. The meander resistive element having a reduced overall length and a reduced total area compared to those of the spiral resistive element may be used as, for example, the voltage detection resistor. Because the product of the resistance value and the parasitic capacitance value (the RC time constant) of the meander resistive element is very small, the responsiveness of the voltage detection may be improved by using, for example, this meander resistive element as the voltage detection resistor. Increased current consumption may thereby be prevented. The reliability may therefore be improved relative to a case where the field plate includes plural meander resistive elements like in the conventional case.

Figure 6A:
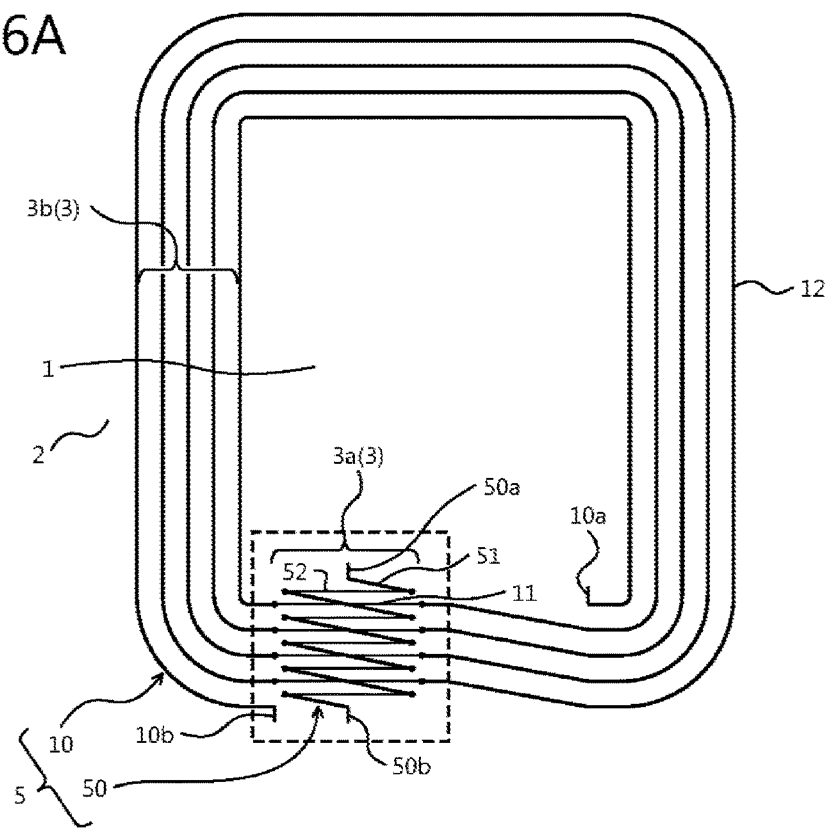
FIGS. 6A and 6B are plan diagrams of a planar layout of the edge termination structure of the semiconductor device according to a second embodiment.
Figure 6B:
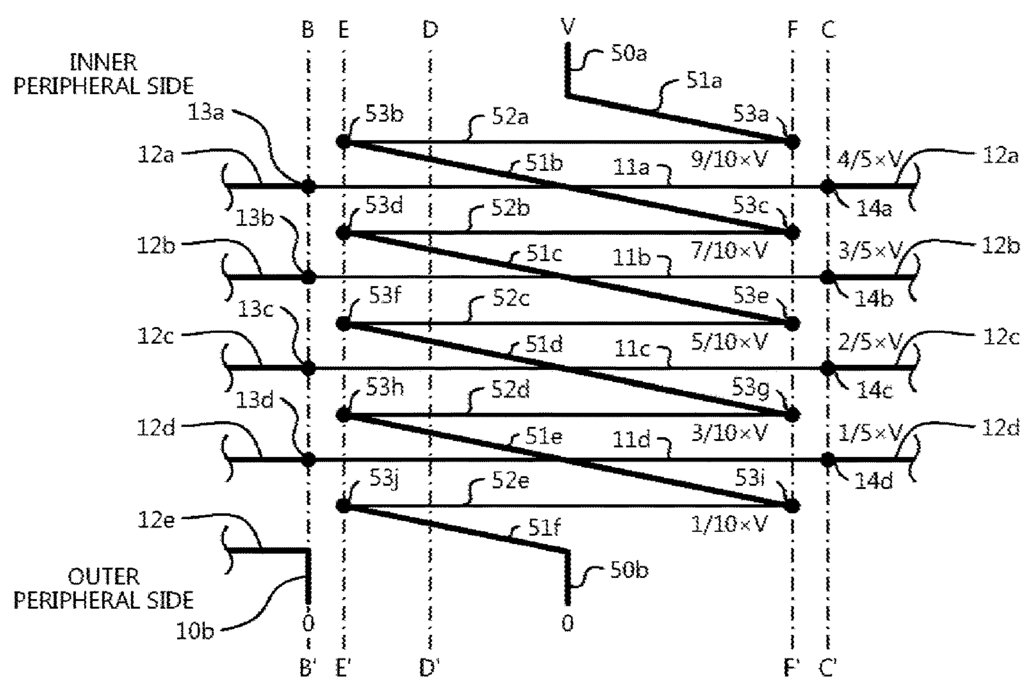

The structure of a semiconductor device according to a second embodiment will be described. FIGS. 6A and 6B are plan diagrams of a planar layout of the edge termination structure of the semiconductor device according to the second embodiment. The semiconductor device according to the second embodiment differs from the semiconductor device according to the first embodiment in the meandering pattern of a meander resistive element 50. For example, the meander resistive element 50 has a meandering pattern formed by alternately providing straight line portions (hereinafter, each referred to as "thin-film resistive straight line portion") 51 each including a resistive material such as polysilicon and straight line portions (hereinafter, each referred to as "conductive film straight line portion") 52 each including a conductive material such as a metal, each sandwiching a turnaround point therebetween.

The thin-film resistive straight line portions 51 (denoted by reference numerals "51*a*" to "51*f*" sequentially from the inner side to the outer side) of the meandering pattern of the meander resistive element 50 are provided, for example, at the same level as that of the thin-film resistive layer 12 of the spiral resistive element 10. The conductive film straight line portions 52 (denoted by reference numerals "52*a*" to "52*e*" sequentially from the inner side to the outer side) of the meandering pattern of the meander resistive element 50 are provided, for example, at the same level as that of the conductive film layer 11 of the spiral resistive element 10. The thin-film resistive straight line portions 51*a* to 51*f* and the conductive film straight line portion 52*a* to 52*e* of the meandering pattern of the meander resistive element 50 are provided at hierarchies different from each other.

The thin-film resistive straight line portions 51 of the meandering pattern of the meander resistive element 50 are provided in a planar layout to be oblique to the conductive film layers 11 and intersect the conductive film layers 11 of the spiral resistive element 10. The conductive film straight line portions 52 of the meandering pattern of the meander resistive element 50 are provided in a planar layout to be parallel to the conductive film layers 11, each between the conductive film layers 11 of the spiral resistive element 10. The conductive film straight line portions 52 of the meandering pattern of the meander resistive element 50 are provided, for example, at equal intervals and alternately with the conductive film layers 11 of the spiral resistive element 10 in the direction from the inner peripheral side to the outer peripheral side.

Preferably, the potential differences ΔV are set to be equal to each other as much as possible as above between the turnaround points of the meandering pattern of the meander resistive element 50 (denoted by reference numerals "53*a*" to "53*j*" sequentially from the inner side to the outer side) and the contact portions 13*a* to 13*d* and 14*a* to 14*d* closest to the turnaround points 53*a* to 53*j*. Preferably, the thin-film resistive straight line portions 51 of the meandering pattern of the meander resistive element 50 and the conductive film layers 11 of the spiral resistive element 10 intersect each other at their midpoints. Preferably, the turnaround points 53 of the meandering pattern of the meander resistive element 50 are each positioned at the center of the adjacent spiral wires (between the adjacent conductive film layers 11) of the spiral resistive element.

The voltage drop generated when the inner side end 50*a* is set at a high potential relative to that of the outer side end 50*b* of the meander resistive element 50 is substantially not generated in the conductive film straight line portion 52 and is generated in only the thin-film resistive straight line portion 51. The potentials of the turnaround points 53*a* to 53*j* of the meandering pattern of the meander resistive element 50 each substantially depend on the voltage drop of the thin-film resistive straight line portion 51. The potential differences ΔV may thereby be set to be substantially equal to each other between the turnaround points 53*a* to 53*j* of the meandering pattern of the meander resistive element 50 and the contact portions 13*a* to 13*d* and 14*a* to 14*d* closest to the turnaround points 53*a* to 53*j*.

It is assumed that the number of the turnaround points of the meandering pattern of the meander resistive element 50 is set to be, for example, 10. As to the straight line portions of the meandering pattern of the meander resistive element 50, the thin-film resistive straight line portion 51*a* is provided on the innermost side, the conductive film straight line portions 52 (52*a* to 52*e*) and the thin-film resistive straight line portions 51 (51*b* to 51*e*) are alternately provided, and the thin-film resistive straight line portion 51*f* is provided on the outermost side. When the thin-film resistive straight line portions 51 of the meandering pattern of the meander resistive element 50 and the conductive film layers 11 (11*a* to 11*d*) of the spiral resistive element 10 are caused to intersect each other at the midpoints thereof, the potential distribution of the meander resistive element 50 is formed as follows.

It is assumed that the potential of the inner side end 50*a* to which the highest potential is applied of the meander resistive element 50 is set to be the potential V [V} that is equal to the potential of the inner peripheral side end 10*a* of the spiral resistive element 10. It is assumed that the potential of the outer side end 50*b* to which the lowest potential is applied of the meander resistive element 50 is set to be zero [V] that is equal to the potential of the outer peripheral side end 10*b* of the spiral resistive element 10. Similar to the first embodiment, as to the potentials of the spiral wires of the spiral resistive element 10, the potential of the spiral wire provided on the outer peripheral side is a potential that is reduced by ⅕×V [V} for each one spiral wire from the potential V [V} of the inner peripheral end 10*a* to the potential zero [V} of the outer peripheral side end 10*b*.

On the other hand, because substantially no voltage drop occurs in the conductive film straight line portions 52, among the turnaround points (hereinafter, referred to as "first to tenth turnaround points") 53*a* to 53*j* of the meandering pattern of the meander resistive element 50, the potentials of the turnaround points positioned at the ends of the same one of the conductive film straight line portions 52 (52*a* to 52*e*) are equal to each other. Because the conductive film layers 11 of the spiral resistive element 10 and the conductive film straight line portions 52 of the meandering pattern of the meander resistive element 50 are alternately provided at equal intervals, the potentials of the turnaround points of the meandering pattern of the meander resistive element 50 are the potentials for the turnaround point provided on the outer side to have a potential reduced by an equal potential for one turnaround point from the potential of V [V] of the inner side end 50*a* to the potential of zero [V] of the outer side end 50*b*.

The potentials of the first and the second turnaround points 53*a* and 53*b* of the meandering pattern of the meander resistive element 50 are 9/10 of the potential V [V] of the inner side end 50*a* of the meander resistive element 50 (=9/10×V [V]). The potentials of the third and the fourth turnaround points 53*c* and 53*d* of the meandering pattern of the meander resistive element 50 are 7/10 of the potential V [V] of the inner side end 50*a* of the meander resistive element 50 (=7/10×V [V]). The potentials of the fifth and the sixth turnaround points 53*e* and 53*f* of the meandering pattern of the meander resistive element 50 are 5/10 of the potential V [V] of the inner side end 50*a* of the meander resistive element 50 (=5/10×V [V]).

The potentials of the seventh and the eighth turnaround points 53*g* and 53*h* of the meandering pattern of the meander resistive element 50 are 3/10 of the potential V [V] of the inner side end 50*a* of the meander resistive element 50 (=3/10×V [V]). The potentials of the ninth and the tenth turnaround points 53*i* and 53*j* of the meandering pattern of the meander resistive element 50 are 1/10 of the potential V [V] of the inner side end 50*a* of the meander resistive element 50 (=1/10×V [V]). The potential differences ΔV of these adjacent conductive film layers (the conductive film layers 11 and the conductive film straight line portions 52) are 1/10×V [V]. As above, the matching of the potential distribution may be established easily by the spiral resistive element 10 and the meander resistive element 50.

Figure 7:
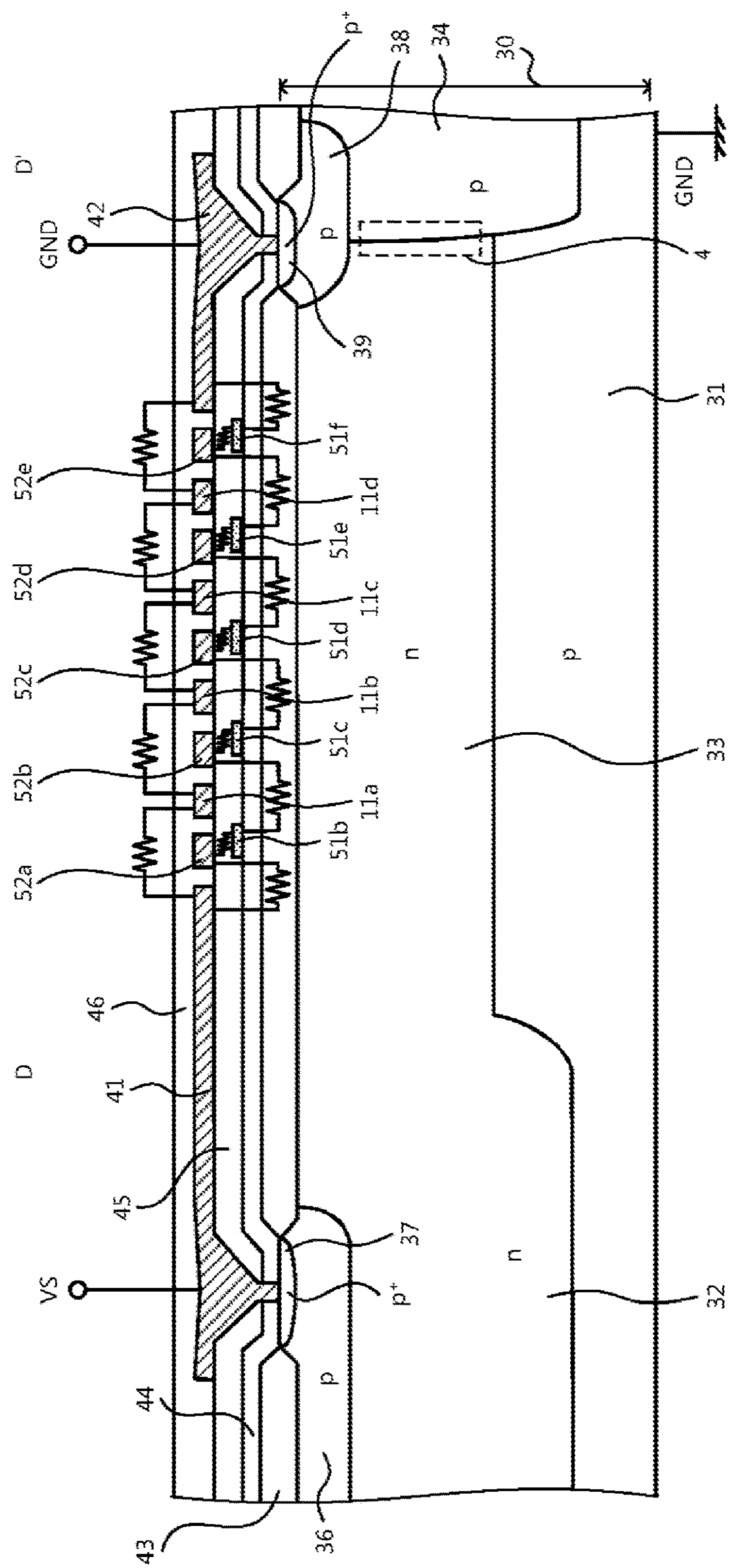
FIG. 7 is a cross-sectional view of a structure taken along a cutting line D-D' in FIGS. 6A and 6B.
Figure 8:
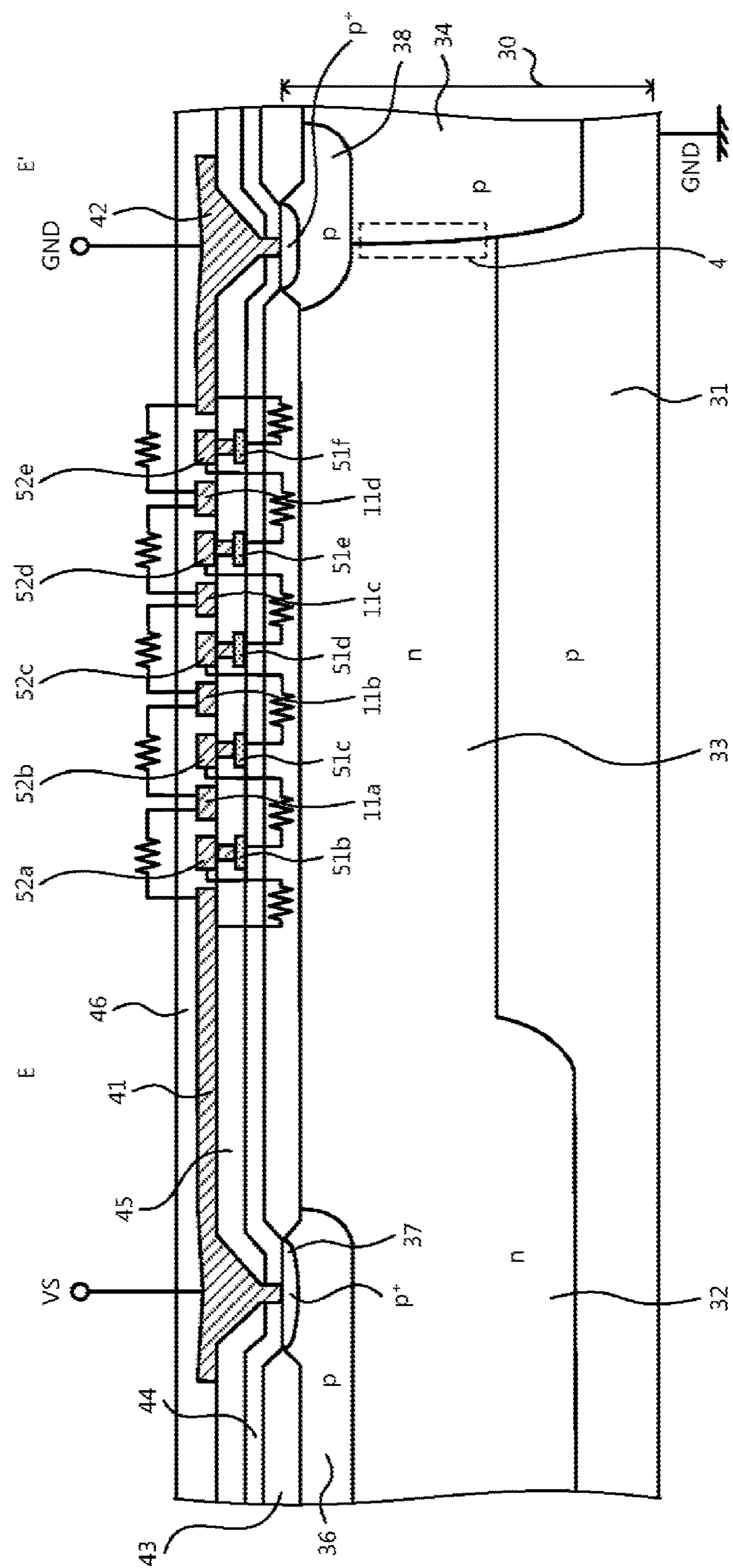
FIG. 8 is a cross-sectional view of the structure taken along a cutting line E-E' in FIGS. 6A and 6B.

FIG. 7 is a cross-sectional view of a structure taken along a cutting line D-D' in FIGS. 6A and 6B. FIG. 8 is a cross-sectional view of the structure taken along a cutting line E-E' in FIGS. 6A and 6B. The cross-section of the structure taken along a cutting line A-A' in FIGS. 6A and 6B is same as that of the first embodiment (FIGS. 2 and 3). The cross-section of the structure taken along a cutting line B-B' in FIGS. 6A and 6B is same as that of the first embodiment (FIG. 4). FIGS. 7 and 8 depict a structure to detect the reference potential (the emitter potential VS of the upper arm IGBT) of the high-side circuit portion using the meander resistive element 20.

As depicted in FIG. 7, the thin-film resistive straight line portions 51 (51*b* to 51*f*) of the meander resistive element 50 are provided in the interlayer insulating film 45 that covers the n-type diffusion region 33 between the $p^+$-type region 37 and the $p^+$-type region 39. The conductive film layers 11 (11*a* to 11*d*) of the spiral resistive element 10 and the conductive film straight line portions 52 (52*a* to 52*e*) of the meander resistive element 50 are provided on the interlayer insulating film 45 in the portion (a first edge termination structure portion 3*a*) having the meander resistive element 50 provided therein.

The conductive film straight line portion 52*a* on the innermost side of the meander resistive element 50 is electrically connected to the second electrode 41. Although not depicted, the thin-film resistive straight line portion 51*f* on the outermost side of the meander resistive element 50 is connected to the third electrode 42. The conductive film straight line portions 52 of the meander resistive element 50 is electrically connected to the thin-film resistive straight line portion 51 facing the conductive film straight line portions 52 in the depth direction, through the interlayer insulating film 45. The cross-section of the structure of the conductive film layers 11 of the spiral resistive element 10 is same as that of the first embodiment.

As depicted in FIG. 8, at the turnaround points 53*b*, 53*d*, 53*f*, 53*h*, and 53*j* to be the ends of the conductive film straight line portions 52 of the meander resistive element 50, the conductive film straight line portions 52 are connected to the thin-film resistive straight line portions 51 facing the conductive film straight line portions 52 in the depth direction, through the contact portions penetrating the interlayer insulating film 45. Although not depicted, the cross-section of the structure taken along a cutting line F-F' that passes through the turnaround points 53*a*, 53*c*, 53*e*, 53*g*, and 53*j* to be the other ends of the conductive film straight line portions 52 of the meander resistive element 50 is also connected to the thin-film resistive straight line portions 51 faced thereby in the depth direction, through the contact portions penetrating the interlayer insulating film 45.

Similar to the first embodiment, a configuration may be employed for the meander resistive element 50 to detect the power source potential VB of the high-side circuit portion. In this case, the conductive film layer 11*a* on the innermost side of the spiral resistive element 10 and the conductive film straight line portion 52*a* on the innermost side of the meander resistive element 50 only have to be electrically connected to the first electrode 40 instead of the second electrode 42.

The conductive film layers 11 of the spiral resistive element 10 and the conductive film straight line portions 52 of the meandering pattern of the meander resistive element 50 may be provided in different hierarchies (not depicted). Intervals such as the intervals of the conductive film layers 11 of the spiral resistive element 10 and the intervals of the conductive film straight line portions 52 of the meandering pattern of the meander resistive element 50 may thereby be reduced. The intervals of the thin-film resistive layers 12 of the spiral resistive element 10 may each be set to be small and adverse effects of charges may be mitigated.

As described above, according to the second embodiment, the same effect as that of the first embodiment may be achieved. According to the second embodiment, the regions corresponding to the arch portions 141 in FIG. 16A and the arch portions 151 in FIG. 16B may be omitted by configuring the meander resistive element to be in the meandering pattern having the thin-film resistive straight line portions and the conductive film straight line portions provided in different hierarchies, alternately provided therein. The regions corresponding to the potential partially bearing regions 143 in FIG. 16A and the potential partially bearing regions 153 in FIG. 16B become maximal. According to the second embodiment, the breakdown voltage may be increased further.

Figure 9A:
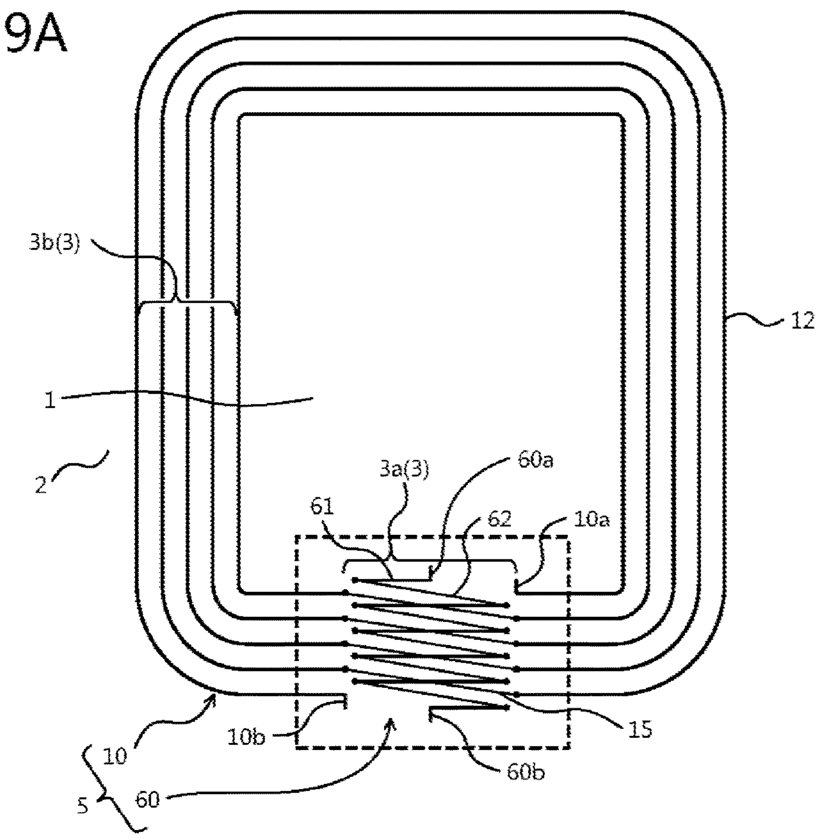
FIGS. 9A and 9B are plan diagrams of the planar layout of the edge termination structure of the semiconductor device according to a third embodiment.
Figure 9B:
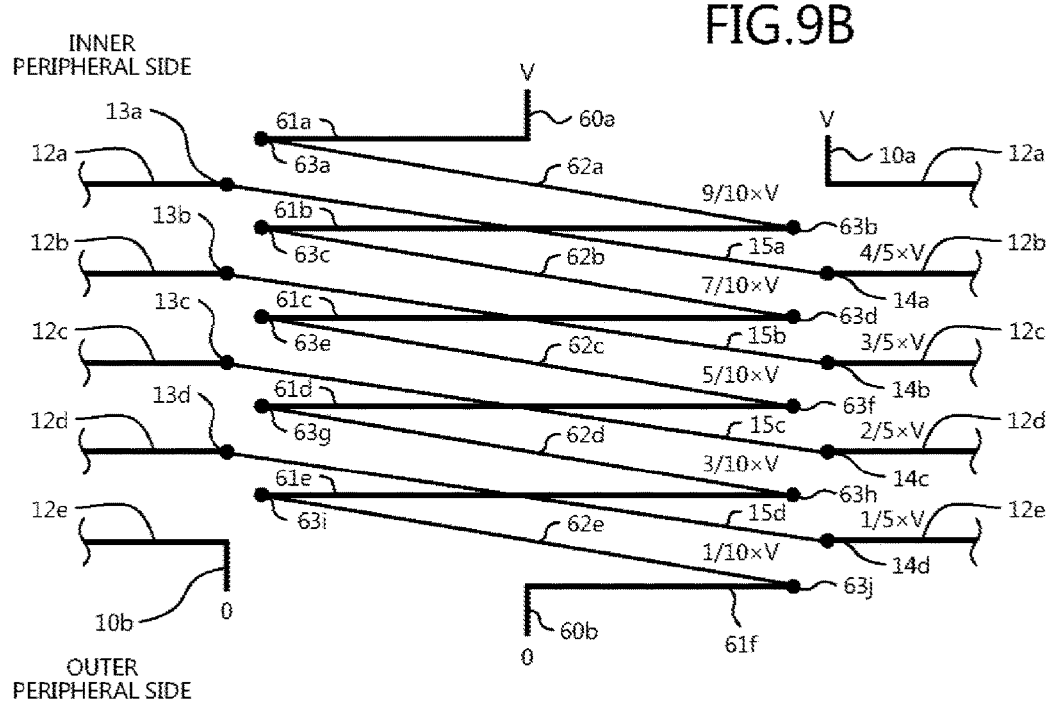

The structure of a semiconductor device according to a third embodiment will be described. FIGS. 9A and 9B are plan diagrams of the planar layout of the edge termination structure of the semiconductor device according to the third embodiment. The semiconductor device according to the third embodiment differs from the semiconductor device according to the second embodiment in the planar layout of the conductive film layers 11 of the spiral resistive element 10. For example, the conductive film layers 15 (15*a* to 15*d*) provided in the first edge termination structure portion 3*a* of the spiral resistive element 10 are provided in a planar layout to be oblique to a direction parallel to the peripheral orientation of the spiral resistive element 10.

Thin-film resistive straight line portions 61 (61*a* to 61*f*) of the meandering pattern of a meander resistive element 60 are provided in a planar layout to be parallel to the peripheral orientation of the spiral resistive element 10 and intersect the conductive film layers 15 of the spiral resistive element 10. Conductive film straight line portions 62 (62*a* to 62*e*) of the meandering pattern of the meander resistive element 60 are provided in a planar layout to be parallel to the conductive film layers 15 between the conductive film layers 15 of the spiral resistive element 10.

When the meander resistive element 60 is provided, the potential differences ΔV between the adjacent conductive film layers (the conductive film layers 15 and the conductive film straight line portions 62) in the first edge termination structure portion 3*a* are each $1/10$×V [V] similar to that of the second embodiment.

As described above, according to the third embodiment, the same effects as those of the first and the second embodiments may be achieved.

Figure 10A:
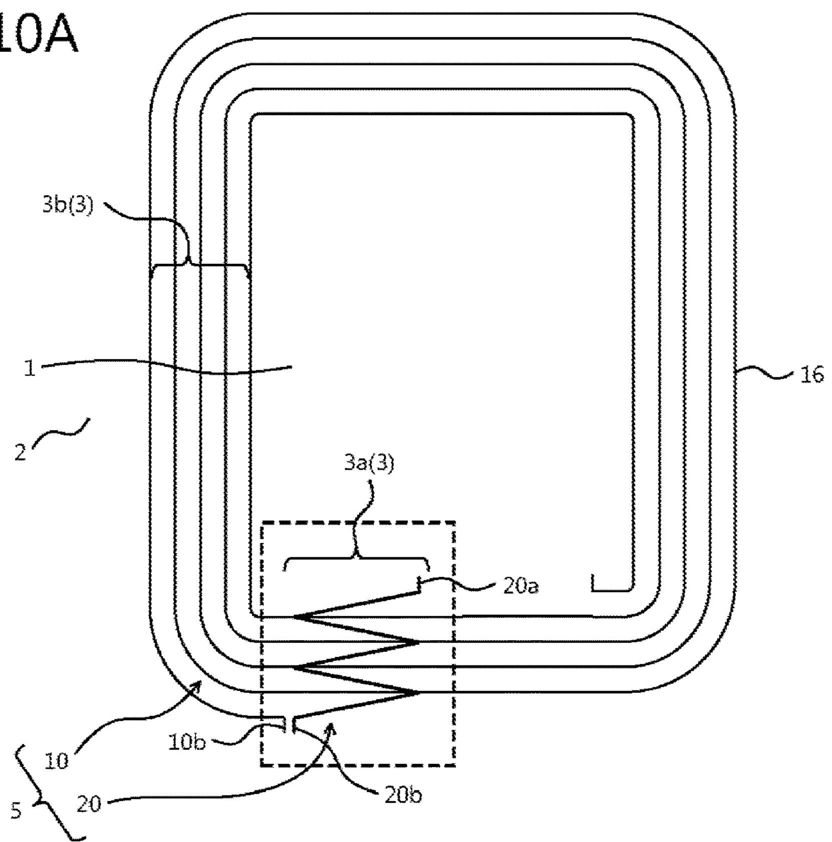
FIGS. 10A and 10B are plan diagrams of the planar layout of the edge termination structure of the semiconductor device according to a fourth embodiment.
Figure 10B:
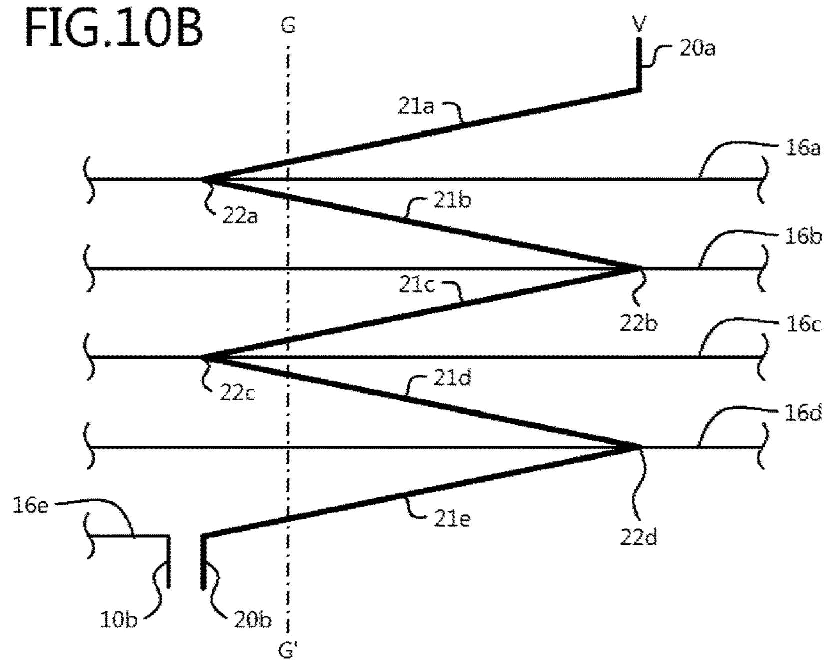
Figure 11:
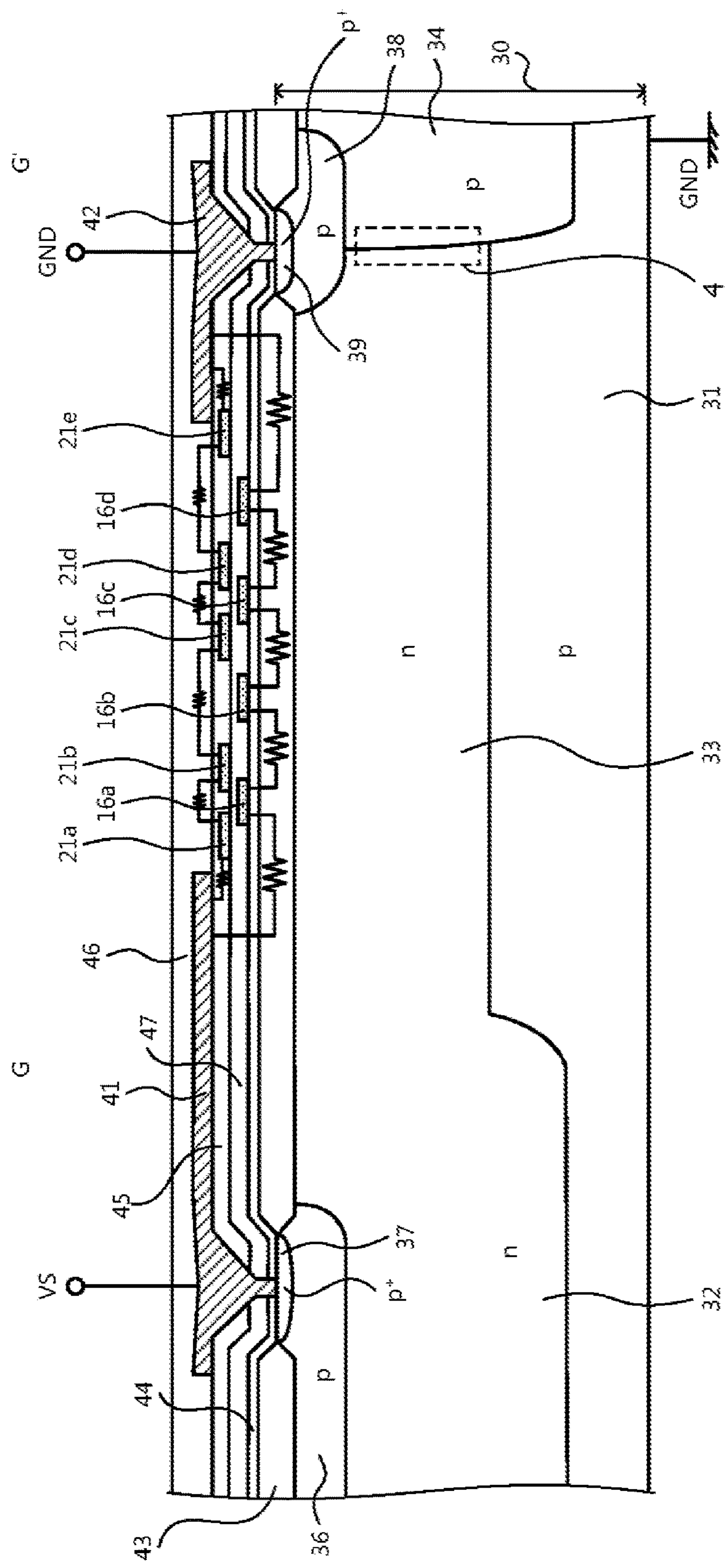
FIG. 11 is a cross-sectional view of the structure taken along a cutting line G-G' in FIG. 10B.

The structure of a semiconductor device according to a fourth embodiment will be described. FIGS. 10A and 10B are plan diagrams of the planar layout of the edge termination structure of the semiconductor device according to the fourth embodiment. FIG. 11 is a cross-sectional view of the structure taken along a cutting line G-G' in FIG. 10B. The semiconductor device according to the fourth embodiment differs from the semiconductor device according to the first embodiment in that the spiral resistive element 10 includes only thin-film resistive layers 16 provided in a spiral planar layout that surrounds the periphery of the high-potential-side region 1. The positional relation in the planar layout is same as that of the first embodiment between the spiral resistive element 10 and the meander resistive element 20.

In the fourth embodiment, as depicted in FIG. 11, a third insulating film 47 is further provided between the second insulating film 44 and the interlayer insulating film 45. In the third insulating film 47, the thin-film resistive layers 16 of the spiral resistive element 10 (that are denoted by reference numerals "16*a*" to "16*e*" sequentially from the inner peripheral side to the outer peripheral side and of which the thin-film resistive layer 16*e* is not depicted in FIG. 11) are provided to face the meander resistive element 20 in the depth direction. The thin-film resistive layer 16 on the innermost side of the spiral resistive element 10 is electrically connected to the second electrode 41, and the thin-film resistive layer 16*e* on the outermost peripheral side thereof is electrically connected to the third electrode 42. The cross-section of the structure of the thin-film resistive straight line portion 21 of the meander resistive element 20 is same as that of the first embodiment.

FIG. 11 depicts a configuration to detect the reference potential (the emitter potential VS of the upper arm IGBT) of the high-side circuit portion using the meander resistive element 20 while, similar to the first embodiment, the configuration may be employed to detect the power source potential VB of the high-side circuit portion using the meander resistive element 50.

Even when both the spiral resistive element 10 and the meander resistive element 20 include only the thin-film resistive layers (the thin-film resistive layers 16, and the thin-film resistive straight line portions 21) as above, the spiral resistive element 10 and the meander resistive element 20 may be provided stacked on each other. Similar to the first embodiment, the potential differences ΔV between the conductive film layers (the thin-film resistive layers 16 and the thin-film resistive straight line portions 21) may each be set to be $1/5$×V [V].

As described above, according to the fourth embodiment, the same effect as that of the first embodiment may be achieved.

Figure 12:
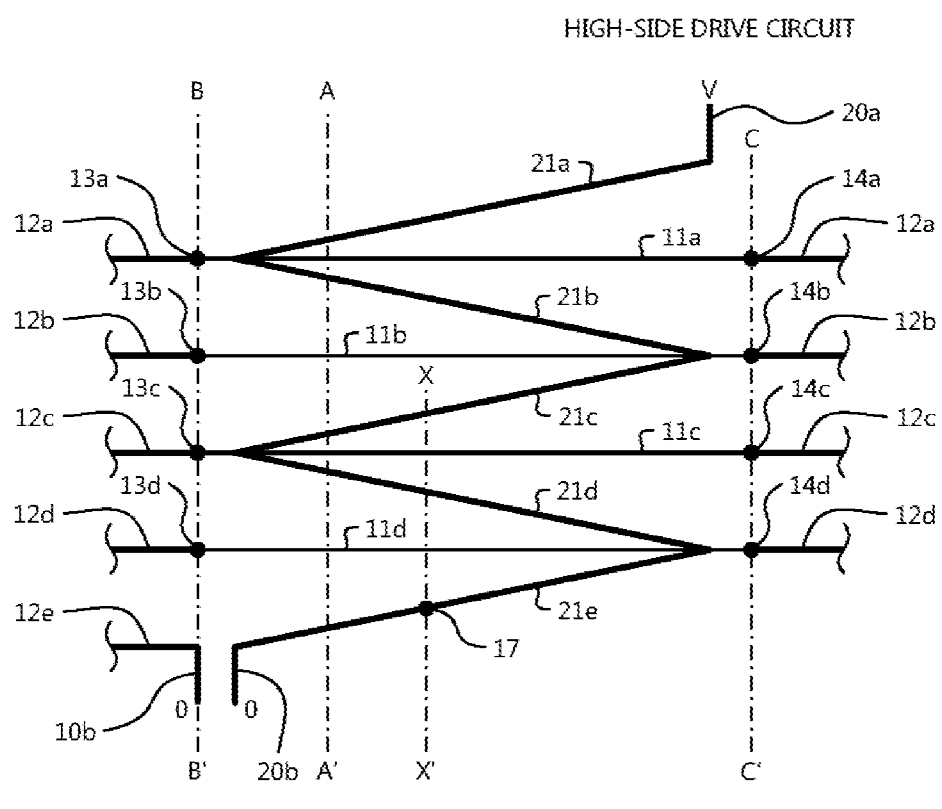
FIG. 12 is a plan diagram of the planar layout of the edge termination structure of the semiconductor device according to a fifth embodiment.
Figure 13:
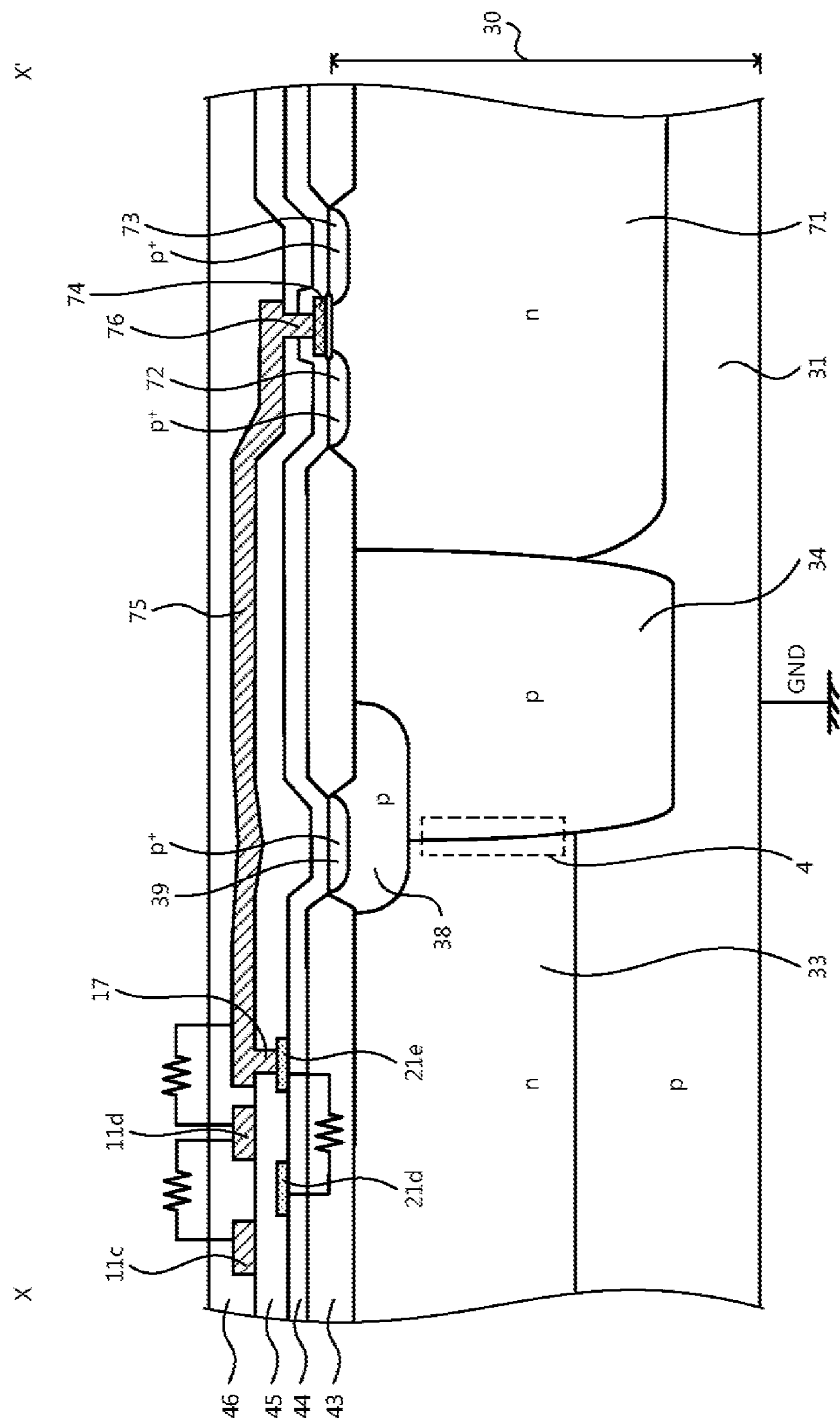
FIG. 13 is a cross-sectional view of the structure taken along a cutting line X-X' in FIG. 12.

The structure of a semiconductor device according to a fifth embodiment will be described. FIG. 12 is a plan diagram of the planar layout of the edge termination structure of the semiconductor device according to the fifth embodiment. FIG. 13 is a cross-sectional view of the structure taken along a cutting line X-X' in FIG. 12. The cross-sections of the structure taken along a cutting line A-A', a cutting line B-B, and a cutting line C-C' in FIG. 12 are same as those of the first embodiment. The semiconductor device according to the fifth embodiment differs from the semiconductor device according to the first embodiment in that the meander resistive element 20 is connected to, for example, a gate electrode 74 of a horizontal p-channel MOSFET provided in the low-potential-side region 2.

As depicted in FIGS. 12 and 13, an n-type diffusion region 71 is provided more outwardly than the p-type diffusion region 34, in the surface layer of the front surface of the p-type semiconductor substrate 30. The n-type diffusion region 71 is electrically separated from the n-type diffusion regions 32 and 33 by the p-type diffusion region 34 and constitutes the low-potential-side region 2. The n-type diffusion region 71 has, for example, a low-side circuit portion (a CMOS circuit formed by complementarily connecting a horizontal n-channel MOSFET and a horizontal p-channel MOSFET) provided therein. The horizontal re-channel MOSFET is not depicted.

The horizontal p-channel MOSFET includes an ordinary planar gate MOS gate structure that includes a $p^+$-type drain region 72, a $p^+$-type source region 73, and a gate electrode 74. A fourth electrode 75 is electrically connected through the gate electrode 74 of the horizontal p-channel MOSFET through the contact portion 76 that penetrates the interlayer insulating film 45. The fourth electrode 75 is connected to the thin-film resistive straight line portion 21*e* on the outermost side of the meander resistive element 20 through the contact portion 17 that penetrates the interlayer insulting film 45.

The fifth embodiment may be applied to each of the second to the fourth embodiments.

As described above, according to the fifth embodiment, the same effects as those of the first to the fourth embodiments may be achieved.

Figure 14:
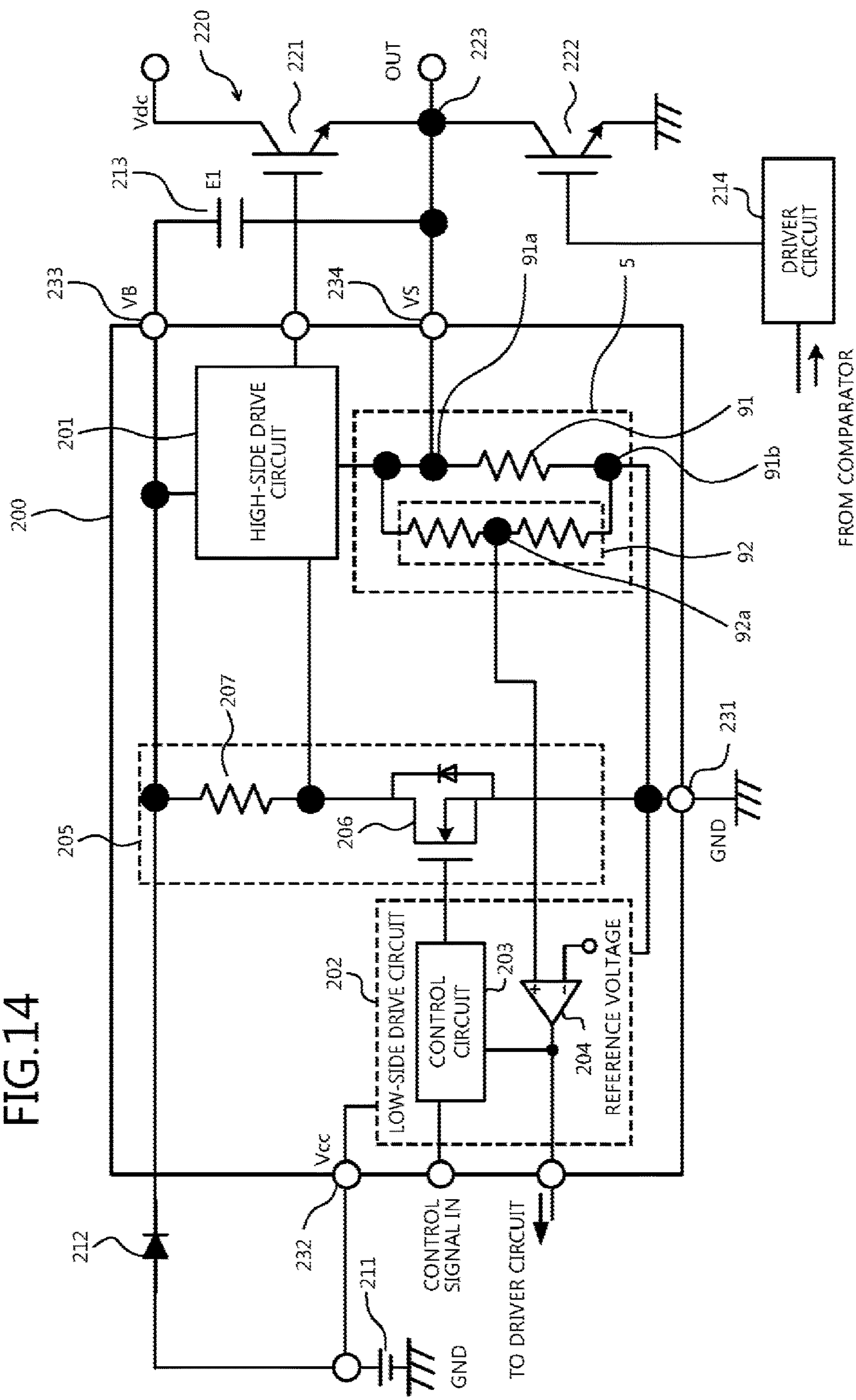
FIG. 14 is a circuit diagram of a circuit configuration of the semiconductor device according to a sixth embodiment.

An example of the circuit configuration to which the semiconductor devices according to the first to the fifth embodiments are applied will be described as a semiconductor device according to a sixth embodiment. FIG. 14 is a circuit diagram of the circuit configuration of the semiconductor device according to the sixth embodiment. The description will be made taking an example of a case, for example, where potentials are detected in driving two insulated gate bipolar transistors (IGBTs) 221 and 222 that constitute a portion for one phase of a bridge circuit to be an output stage. The IGBTs 221 and 222 are connected to each other in series, between a high voltage power source Vdc and the ground potential GND. The semiconductor device 200 according to the sixth embodiment depicted in FIG. 14 includes a high-side driving circuit 201, a low-side driving circuit 202, a level shift circuit 205, first to fourth terminals 231 to 234, and the resistive field plate 5, on a single semiconductor chip.

The first terminal 231 is a terminal that supplies the ground potential GND of the semiconductor device 200. The second terminal 232 is a terminal that supplies a power source voltage Vcc from the voltage power source 211 to the semiconductor device 210. The third terminal 233 is a terminal that supplies the power source potential VB of the high-side driving circuit 201. The fourth terminal 234 is a terminal that supplies the emitter potential VS of the IGBT 221 of the upper arm. The power source potential VB is the total of the emitter potential VS of the IGBT 221 of the upper arm and the high-side power source. A voltage E1 charged in a bootstrap capacitor 213 from the voltage power source 211 through a bootstrap diode 212 is a high-side power source. The emitter potential VS of the IGBT 221 of the upper arm is the potential at a connection point 223 between the IGBT 221 of the upper arm and the IGBT 222 on the low potential side (hereinafter, referred to as "lower arm"). The connection point 223 is an output terminal "OUT" of the bridge circuit 220.

The high-side driving circuit 201 operates at the power source voltage Vcc using the emitter potential VS of the IGBT 221 of the upper arm as the reference potential and the power source potential VB as the highest potential. The high-side driving circuit 201 drives the IGBT 221 of the upper arm based on an input signal of the level shift circuit 205. The low-side driving circuit 202 operates using, for example, the ground potential GND as the reference potential. The control circuit 203 uses the ground potential GND as a reference, operates at the power source voltage Vcc supplied from the second terminal 232, and drives an nch-MOSFET 206 of the level shift circuit 205 for increasing the level based on a control signal IN from an external source (such as a microcomputer) and an abnormality detection signal from an abnormality detecting circuit.

A comparator 204 compares the potential of an intermediate potential point 92*a* of a sensing resistor 92 to the predetermined reference voltage. The output (the comparison result) of the comparator 204 is input to the high-side driving circuit 201 through the control circuit 203 and the level shift circuit 205. The output of the comparator 204 is input to a driver circuit 214. The driver circuit 214 drives the IGBT 222 of the lower arm. The driver circuit 214 may be provided on the same semiconductor chip as that of the semiconductor device 200. The level shift circuit 205 includes the high voltage nch-MOSFET 206 and a level shift resistor 207. The level shift circuit 205 receives an input signal of the low-side driving circuit 202 and drives the high-side driving circuit 201.

Resistors 91 and 92 are connected between the fourth terminal 234 and the first terminal 231. The resistor 91 corresponds to the spiral resistive element 10 of the first to the fifth embodiments. A connection point 91*a* between the fourth terminal 234 and the resistor 91 corresponds to the inner peripheral side end 10*a* of the spiral resistive element 10. A connection point 91*b* between the first terminal 231 and the resistor 91 corresponds to the outer peripheral side end 10*b* of the spiral resistive element 10. The resistor 92 corresponds to each of the meander resistive elements 20, 50, and 60 of the first to the fifth embodiments. The resistors 91 and 92 correspond to the resistive field plate of each of the first to the fifth embodiments. The resistor (hereinafter, referred to as "sensing resistor") 92 is a voltage division resistor for detecting the emitter potential VS of the IGBT 221 of the upper arm.

The semiconductor device 200 depicted in FIG. 14 detects the emitter potential VS (hereinafter, referred to as "VS potential") of the IGBT 21 of the upper arm by using the sensing resistor 92 as a voltage division resistor. When the comparator 204 determines that the VS potential becomes lower than the reference voltage, the semiconductor device 200 depicted in FIG. 14 executes control to give a warning by an alarm, turning off of the IGBT 221 of the upper arm using the high-side driving circuit 201, turning off of the IGBT 222 of the lower arm using the driving circuit 214, or the like.

As described above, according to the sixth embodiment, the same effects as those of the first to the fifth embodiments is achieved.

Figure 15:
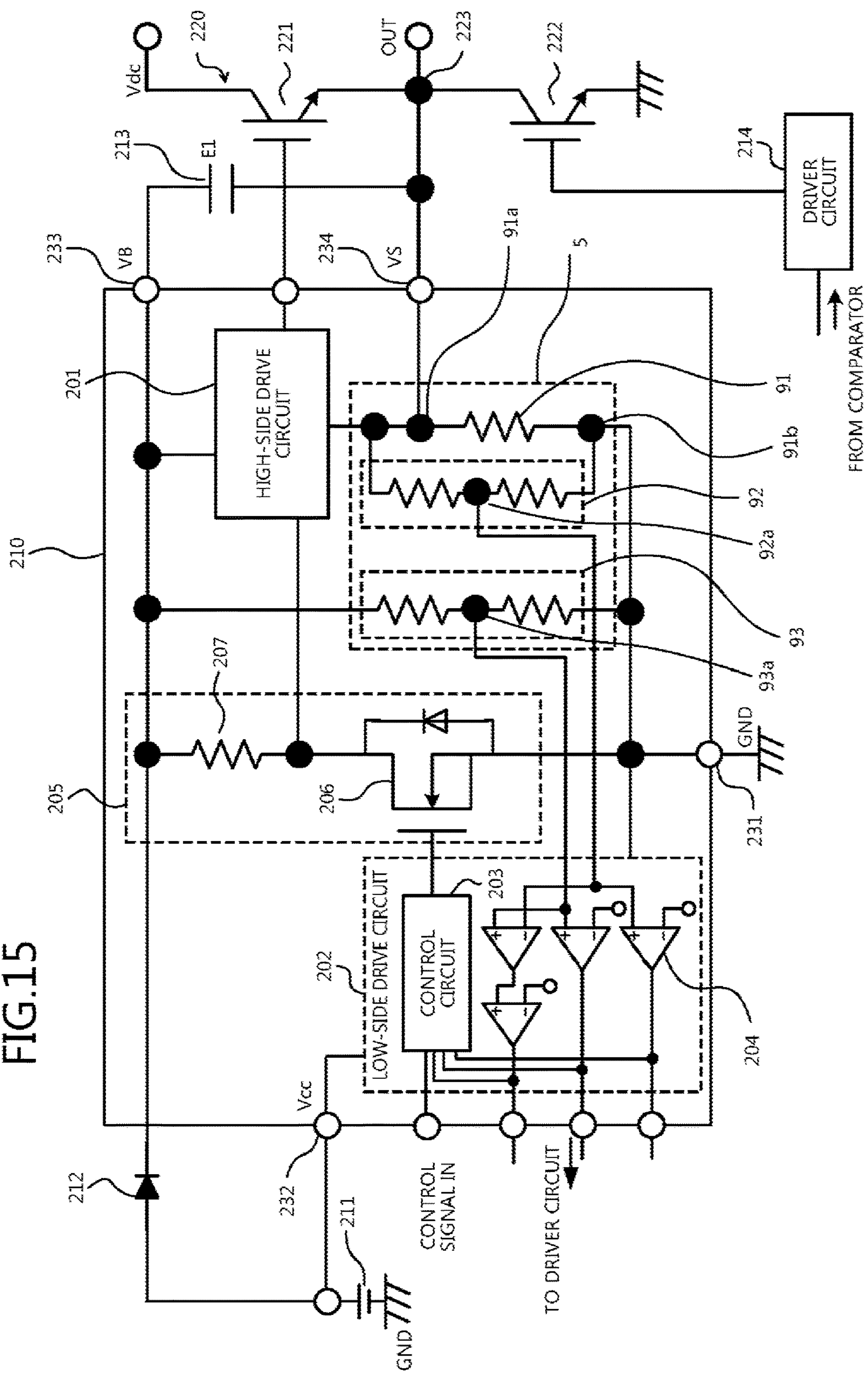
FIG. 15 is a circuit diagram of the circuit configuration of the semiconductor device according to a seventh embodiment.

An example of the circuit configuration to which the semiconductor devices according to the first to the fifth embodiments are applied will be described as a semiconductor device according to a seventh embodiment. FIG. 15 is a circuit diagram of the circuit configuration of the semiconductor device according to the seventh embodiment. The circuit configuration of the semiconductor device 210 according to the seventh embodiment differs from the circuit configuration of the semiconductor device according to the sixth embodiment in that another sensing resistor (hereinafter, referred to as "second sensing resistor") 93 is further included therein and acts as a voltage division resistor to detect the power source potential VB of the high-side driving circuit 201. The second sensing resistor 93 corresponds to each of the meander resistive elements 20, 50, and 60 of the first to the fifth embodiments. In the seventh embodiment, two meander resistive elements are included and disposed to overlap the conductive film layer of the spiral resistive element through the interlayer insulating film. The two meander resistive elements may be provided adjacent to each other or may be provided away from each other.

The second sensing resistor 93 is connected between the third terminal 233 and the first terminal 231. In this case, the low-side driving circuit 202 includes plural comparators 204, and the intermediate potential point 92*a* of the sensing resistor (hereinafter, referred to as "first sensing resistor") 92 and the intermediate potential point 93*a* of the second sensing resistor 93 are each connected to the comparator 204 different from that of each other. Similar to the sixth embodiment, the comparator 204 compares the potential of the intermediate potential point 92*a* of the first sensing resistor 92 to a predetermined reference voltage. The comparator 204 compares the potential of the intermediate potential point 93*a* of the second sensing resistor 93 to the predetermined reference voltage. The comparator 204 compares the voltage between the intermediate potential point 92*a* of the first sensing resistor 92 and the intermediate potential point 93*a* of the second sensing resistor 93 (the voltage E1 of the bootstrap capacitor 213) to a predetermined reference voltage. Similar to the sixth embodiment, an output of the comparator 204 is input into the high-side driving circuit 201 and the driver circuit 214.

The semiconductor device 210 depicted in FIG. 15 detects partial voltages of the first and the second sensing resistors 92 and 93 and thereby, detects the power source potential VB of the high-side driving circuit 201 (hereinafter, referred to as "VB potential"), the emitter potential VS of the IGBT 221 of the upper arm (hereinafter, referred to as "VS potential"), and the voltage between the VB potential and the VS potential (hereinafter, referred to as "between-VB-VS voltage"). When the comparator 204 determines that at least one potential of the VB potential and the VS potential becomes lower than the reference voltage, the semiconductor device 210 depicted in FIG. 15 executes control o give a warning by an alarm, turning off of the IGBT 221 of the upper arm using the high-side driving circuit 201, turning off of the IGBT 222 of the lower arm using the driving circuit 214, or the like. When the comparator 204 determines that the between-VB-VS voltage becomes lower than the reference voltage, the semiconductor device 210 depicted in FIG. 15 controls the driver circuit 214 to increase the pulse width during the ON-time period of the IGBT 222 of the lower arm to thereby extend the time period for charging the bootstrap capacitor 213. The function same as that of the level shift circuit for reducing the level may be obtained by providing the first and the second sensing resistors 92 and 93 without using any level shift circuit to reduce the level.

As described above, according to the seventh embodiment, the same effects as those of the first to the sixth embodiments is achieved.

Figure 20:
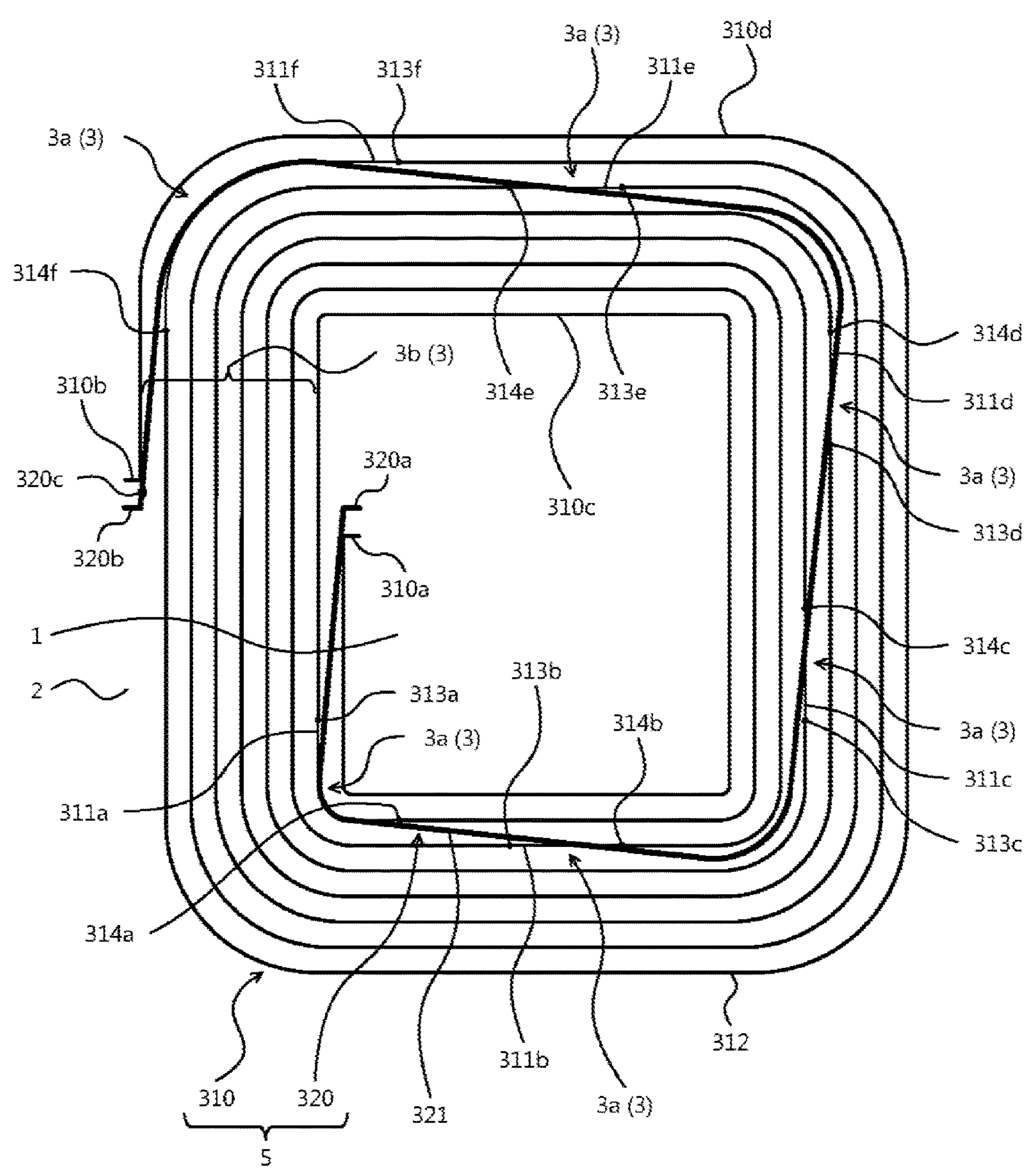
FIG. 20 is a plan diagram of the planar layout of the edge termination structure of the semiconductor device according to an eighth embodiment.
Figure 21:
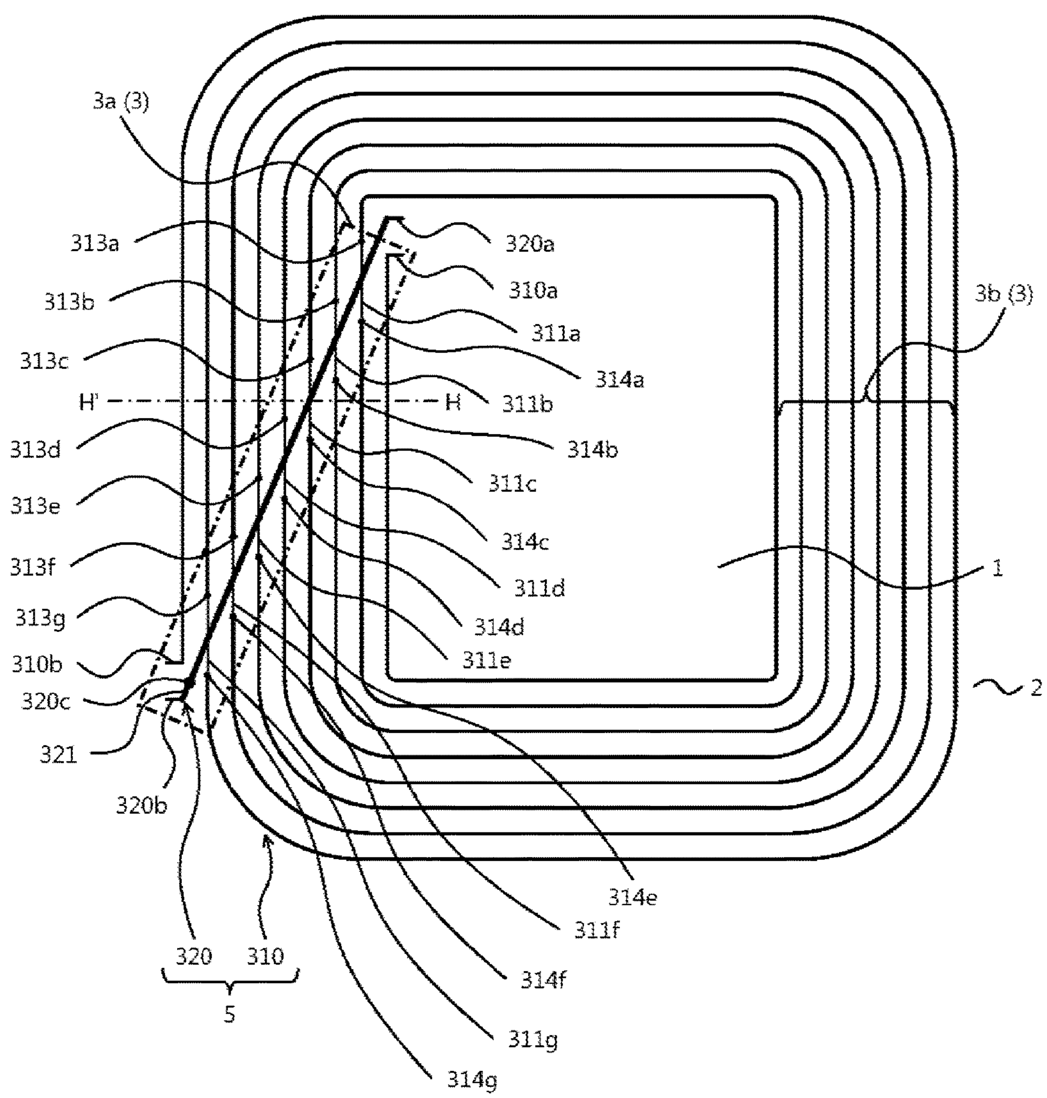
FIG. 21 is a plan diagram of the planar layout of another example of the edge termination structure of the semiconductor device according to the eighth embodiment.

The structure of a semiconductor device according to an eighth embodiment will be described. FIG. 20 is a plan diagram of the planar layout of the edge termination structure of the semiconductor device according to the eighth embodiment. FIG. 21 is a plan diagram of the planar layout of another example of the edge termination structure of the semiconductor device according to the eighth embodiment. FIGS. 20 and 21 each depict the planar layout of the overall resistive field plate 5. The semiconductor device according to the eighth embodiment differs from the semiconductor device according to the first embodiment in that one or more spiral resistive element(s) is/are further included therein instead of the meander resistive element. The resistive field plate 5 includes only the two or more spiral resistive elements each having a number of the spiral wires different from that of each other.

The description will be made taking an example of a case where the resistive field plate 5 includes the two spiral resistive elements. For example, the resistive field plate 5 includes a first spiral resistive element 310 and a second spiral resistive element 320 whose number of the spiral wires is fewer than that of the first spiral resistive element 310. The first and the second spiral resistive elements 310 is provided in a spiral planar layout surrounding the periphery of the high-potential-side region 1, from the side of the high-potential-side region 1 to the side of the low-potential-side region 2. The function of the first spiral resistive element 310 is same as that of the spiral resistive element of the first embodiment. The spiral wire of the first spiral resistive element 310 is provided to have a substantially equal width and to be at substantially equal intervals. The reason for this is same as that of the first embodiment.

Similar to the first embodiment, for the first spiral resistive element 310, a conductive film layer 311 including a conductive material such as, for example, a metal is provided in the first edge termination structure portion 3*a* and a thin-film resistive layer 312 including a resistive material such as, for example, polysilicon having an impurity dosed therein is provided in the second edge termination structure portion 3*b*. The conductive film layers 311 of the first spiral resistive element 310 are provided at positions at which the conductive film layers 311 intersect with the second spiral resistive element 320 as viewed from the side of the front surface of the semiconductor chip as described later. The conductive film layers 311 of the first spiral resistive element 310 each have a planar shape of a straight line or a substantial arch, along the spiral pattern of the first spiral resistive element 310, and the planar shape and the length thereof are different for each intersection point with the second spiral resistive element 320.

The second spiral resistive element 320 is provided in the edge termination structure portion 3 to intersect portions (the conductive film layers 311) of the first spiral resistive element 310 as viewed from the side of the front surface of the semiconductor chip. The second spiral resistive element 320 is provided between, for example, the spiral wire 310*c* on the innermost periphery of the first spiral resistive element 310 and the spiral wire 310*d* on the outermost periphery thereof. FIGS. 20 and 21 each depict the second spiral resistive element 320 using a solid line thicker than that of the first spiral resistive element 310 to clearly depict the planar layouts of the first spiral resistive element 310 and the second spiral resistive element 320. The conductive film layer 311 of the first spiral resistive element 310 is depicted using a solid line thinner than that of the thin-film resistive layer 312 of the first spiral resistive element 310.

The second spiral resistive element 320 has a thin-film resistive layer 321 including a resistive material such as, for example, polysilicon having an impurity dosed therein, provided in the edge termination structure portion 3. The second spiral resistive element 320 is provided at a level different from that of the conductive film layers 311 of the first spiral resistive element 310 in the first edge termination structure portion 3*a*, and faces the conductive film layers 311 in the depth direction sandwiching an interlayer insulating film (not depicted) therebetween. The length of each of the conductive film layers 311 of the first spiral resistive element 310 is set to be a length of the extent that the thin-film resistive layers 312 and 321 of the first and the second spiral resistive elements 310 and 320 are prevented from overlapping each other in the depth direction caused by dispersion in the manufacturing process, and to be as short as possible. The second spiral resistive element 320 may be provided in the same level as that of the thin-film resistive layer 312 of the first spiral resistive element 310.

Similar to the meander resistive element of the first embodiment, the second spiral resistive element 320 is used as, for example, the sensing resistors 92 and 93 (see FIGS. 14 and 15) to detect the emitter potential VS (the VS potential) of the IGBT 221 of the upper arm and the power source potential VB of the high-side driving circuit 201. The potentials to be the intermediate potential points 92*a* and 93*a* of the sensing resistor 92 and 93 are extracted from, for example, a predetermined potential point 320*c* on the side of the outer side end 320*b* to which the lowest potential of the second spiral resistive element 320 is applied.

Preferably, the first and the second spiral resistive elements 310 and 320 are provided such that no potential difference is generated between the potential distribution generated by the first spiral resistive element 310 and the potential distribution generated by the second spiral resistive element 320. Preferably, the second spiral resistive element 320 is provided in a planar layout to have a potential substantially equal to that of the conductive film layer 311 at the point intersecting the first spiral resistive element 310. Local concentration of the electric field may thereby be prevented at the first and the second spiral resistive elements 310 and 320.

For example, inner side ends 310*a* and 320*a* to which the highest potential of the first and the second spiral resistive elements 310 and 320 is applied are provided to be close to each other, and outer side ends 310*b* and 320*b* to which the lowest potential of the first and the second spiral resistive elements 310 and 320 is applied are provided to be close to each other. The second spiral resistive element 320 is provided such that the potential difference between the inner side end 320*a* of the second spiral resistive element 320 and the intersection point of the first and the second spiral resistive elements 310 and 320 is equal to the potential difference between the inner side end 310*a* of the first spiral resistive element 310 and the intersection point.

By providing the second spiral resistive element 320 as above, potential differences may be prevented at the point at which the first spiral resistive element 310 and the second spiral resistive element 320 intersect each other, by merely designing the width of the spiral wire and the intervals of the spiral wires such that the first and the second spiral resistive elements 310 and 320 each have a uniform potential distribution. The inner side ends 310*a* and 320*a* of the first and the second spiral resistive elements 310 and 320 may be in contact with each other. The outer side ends 310*b* and 320*b* of the first and the second spiral resistive elements 310 and 320 may be in contact with each other.

The number of turns of the spiral (the number of the spiral wires) of the second spiral resistive element 320 may be varied. For example, the number of turns of the spiral wire of the second spiral resistive element 320 is determined by, for example, the response time period in a case where a predetermined voltage value is detected. The number of turns of the spiral wire of the second spiral resistive element 320 is set such that the resistance value and the parasitic capacitance associated with the resistance value are somewhat reduced to the extent that the second spiral resistive element 320 may be used as the sensing resistors 92 and 93 as above and the resistance value is increased to the extent that the current consumed by the second spiral resistive element 320 (the current consumption) may be suppressed to be equal to or lower than a predetermined value. The potential distribution of each of the first and the second spiral resistive elements 310 and 320 only has to be uniform, and the direction of the turn of the spiral wire of the second spiral resistive element 320 may be the inverse rotation against the direction of the turn of the spiral wire of the first spiral resistive element 310.

For example, FIG. 20 depicts a case where the number of turns of the spiral wire of the first spiral resistive element 310 is set to be eight turns, the number of turns of the spiral wire of the second spiral resistive element 320 is set to be one turn (the number of the spiral wires is one) in the same direction as that of the turn of the first spiral resistive element 310, and the first spiral resistive element 310 and the second spiral resistive element 320 intersect each other at six points. In this case, the first spiral resistive element 310 includes six conductive film layers 311. The conductive film layers 311 of the first spiral resistive element 310 are provided, for example, such that one thereof is provided at the spiral wire of each turn except the spiral wires on the innermost periphery and the outermost periphery of the first spiral resistive element 310, and are present scattered along the second spiral resistive element 320 that has the spiral shape. The six conductive film layers 311 are denoted by reference numerals "311*a*" to "311*f*" sequentially from the inner peripheral side to the outer peripheral side. The contact portions for the ends of the conductive film layers 311 and the thin-film resistive layers 312 are denoted by reference numerals "313*a*" to "313*f*" sequentially from the inner peripheral side to the outer peripheral side. The contact portions for the other ends of the conductive film layers 311 and the thin-film resistive layers 312 are denoted by reference numerals "314*a*" to "314*f*" sequentially from the inner peripheral side to the outer peripheral side.

The number of turns of the spiral wire of the second spiral resistive element 320 may be equal to or more than one turn (not depicted) or may be less than one turn. When the number of turns of the spiral wire of the second spiral resistive element 320 is, for example, ½ turn, the second spiral resistive element 320 is provided in, for example, an arch-like planar layout (not depicted). When the number of turns of the spiral wire of the second spiral resistive element 320 is, for example, a ¼ turn, the second spiral resistive element 320 may be provided in, for example, a straight line-like planar layout as in the other example depicted in FIG. 21.

FIG. 21 depicts as the other example of a case where the number of turns of the spiral wire of the first spiral resistive element 310 is set to be eight turns, the number of turns of the spiral wire of the second spiral resistive element 320 is set to be ¼ turns, and the first spiral resistive element 310 and the second spiral resistive element 320 intersect each other at seven points. In this case, the second spiral resistive element 320 is provided to be positioned oblique to the direction of the turn of the spiral wire of the first spiral resistive element 310, and is provided to pass through all the spiral wires except the spiral wires on the innermost periphery and on the outermost periphery of the first spiral resistive element 310. The first spiral resistive element 310 includes seven conductive film layers 311. The seven conductive film layers 311 are provided, for example, such that one thereof is provided on the spiral wire of each turn except the spiral wires on the innermost periphery and the outermost periphery of the first spiral resistive element 310, and is present being scattered along the second spiral resistive element 320 having the straight line shape.

The seven conductive film layers 311 in FIG. 21 are denoted by reference numerals "311*a*" to "311*g*" sequentially from the inner peripheral side to the outer peripheral side. Contact portions for ends of the conductive film layers 311 and the thin-film resistive layers 312 are denoted by reference numerals "313*a*" to "313*g*" sequentially from the inner peripheral side to the outer peripheral side. Contact portions for the other ends of the conductive film layers 311 and the thin-film resistive layers 312 are denoted by reference numerals "314*a*" to "314*g*" sequentially from the inner peripheral side to the outer peripheral side. In the other example depicted in FIG. 21, the inner side end 310*a* and the outer side end 310*b* of the first spiral resistive element 310 extend to respectively approach the inner side end 320*a* and the outer side end 320*b* of the second spiral resistive element 320, and the number of spiral wires facing the first spiral resistive element 310 is nine in the portion having the second spiral resistive element 320 provided therein.

For example, the number of turns of the spiral wire, the width of the spiral wire, and the intervals of the spiral wires of the first spiral resistive element 310 are determined to be able to obtain the breakdown voltage and the reliability necessary for the edge termination structure portion 3. The number of turns of the spiral wire of the second spiral resistive element 320 is determined by the width of the edge termination structure portion 3 (the width in the direction from the inner side to the outer side), the circuit configuration of the high-side circuit portion provided in the high-potential-side region 1, and the dose amount (the resistance value) of the thin-film resistive layer 321 constituting the second spiral resistive element 320. The width of the spiral wire and the intervals of the spiral wires of the second spiral resistive element 320 may be different from those of the first spiral resistive element 310. When the resistive field plate 5 includes two or more spiral resistive elements, in a portion having the spiral resistive elements intersecting each other, a portion of one of the spiral resistive elements is used as a conductive film layer.

Figure 22:
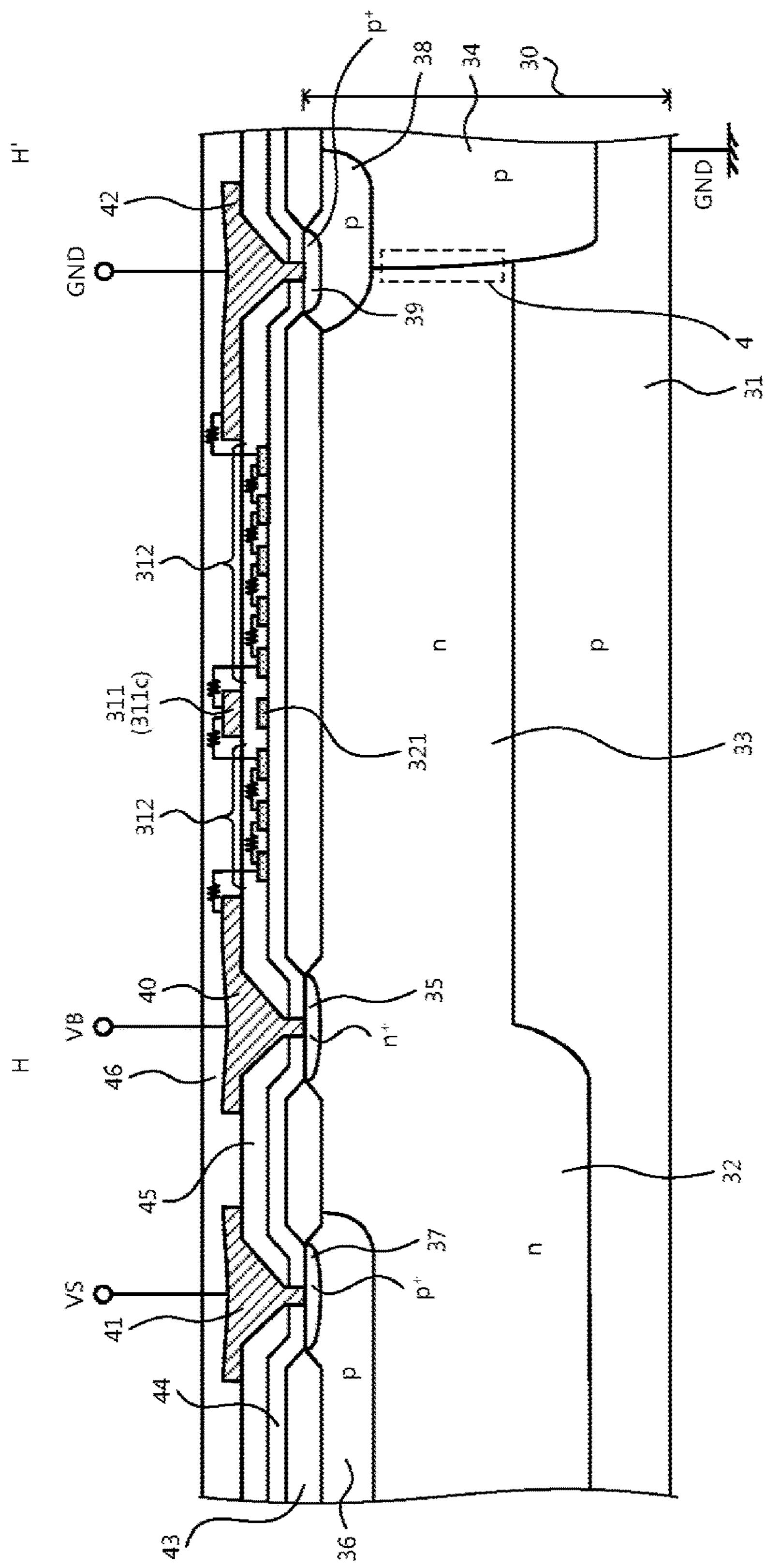
FIG. 22 is a cross-sectional view of the structure taken along the cutting line H-H' in FIG. 21.

A cross-section of the structure of the semiconductor device according to the eighth embodiment will be described taking an example of a cross-section of the structure taken along a cutting line H-H' in FIG. 21. FIG. 22 is a cross-sectional view of the structure taken along the cutting line H-H' in FIG. 21. The description will be made taking the example of the cross-section of the structure taken along the cutting line H-H' passing through the conductive film layer 311*c* that is parallel to the direction from the inner peripheral side to the outer peripheral side of the first spiral resistive element 310 and that is provided on the spiral wire of the third turn of the first spiral resistive element 310. As depicted in FIG. 22, the thin-film resistive layer 312 of the first spiral resistive element 310 is provided in the interlayer insulating film 45 that covers the n-type diffusion region 33 between the $n^+$-type region 35 and the $p^+$-type region 39.

The thin-film resistive layer 321 of the second spiral resistive element 320 is provided away from the thin-film resistive layer 312 of the first spiral resistive element 310 in the interlayer insulating film 45 that covers the n-type diffusion region 33 between the $n^+$-type region 35 and the $p^+$-type region 39. The thin-film resistive layer 321 of the second spiral resistive element 320 is adjacent to and on the outer side of (the side of the second electrode 42) the thin-film resistive layer 312 that is third (the spiral wire in the third turn) from the inner side (the side of the first electrode 40) of the first spiral resistive element 310. The conductive film layer 311 (FIG. 22 depicts the conductive film layer 311*c*) of the first spiral resistive element 310 is provided in the interlayer insulating film 46. The conductive film layer 311 of the first spiral resistive element 310 faces the thin-film resistive layer 321 of the second spiral resistive element 320 in the depth direction through the interlayer insulating film 46. In the first edge termination structure portion 3*a* (the cross section taken along the cutting line H-H'), a field plate is configured that includes the thin-film resistive layers 312 and 321 of the first and the second spiral resistive elements 310 and 320 as the first layer and the conductive film layers 11 of the first spiral resistive element 310 as the second layer.

The thin-film resistive layer 312 on the innermost side (the side of the first electrode 40) of the first spiral resistive element 310 is electrically connected to the first electrode 40, and the thin-film resistive layer 312 on the outermost side (the side of the second electrode 42) thereof is electrically connected to the second electrode 42. Among the thin-film resistive layers 312 of the first spiral resistive elements 310, the three thin-film resistive layers 312 farther inward than the thin-film resistive layer 321 of the second spiral resistive element 320 are electrically connected to each other. The thin-film resistive layer 312 on the outermost side of the three thin-film resistive layers 312 is electrically connected to the conductive film layer 311*c* of the first spiral resistive element 310. Among the thin-film resistive layers 312 of the first spiral resistive element 310, five thin-film resistive layers 312 that are provided more outwardly than the thin-film resistive layer 321 of the second spiral resistive element 320 are electrically connected to each other. The thin-film resistive layer 312 on the innermost side of the five thin-film resistive layers 312 is electrically connected to the conductive film layer 311*c* of the first spiral resistive element 310.

Although not depicted, a cross-section of the structure taken by cutting along a cutting line that passes through the conductive film layers 311*a*, 311*b*, and 311*d* to 311*g* (see FIG. 21) other than the conductive film layer 311*c* of the first spiral resistive element 310 is same as the cross-section of the structure depicted in FIG. 22 excluding the following two points. The first different point is that the positions of the other conductive film layers 311*a*, 311*b*, and 311*d* to 311*g* between the first and the second electrodes 40 and 42 are different. The second different point is that the thin-film resistive layer 321 of the second spiral resistive element 320 is provided at a position facing, in the depth direction, the other conductive film layers 311*a*, 311*b*, and 311*d* to 311*g*, and the number of the thin-film resistive layers 312 (the number of turns) of the first spiral resistive element 310 provided more inwardly and more outwardly than the thin-film resistive layer 321 is different.

The number of the thin-film resistive layers 312 of the first spiral resistive element 310 provided more inwardly than the conductive film layers 311 (311*a*, 311*b*, and 311*d* to 311*g*) becomes smaller and the number of the thin-film resistive layers 312 of the first spiral resistive element 310 provided more outwardly than the conductive film layers 311 becomes greater, as these conductive film layers 311 are provided on the spiral wires that are present more inwardly than the periphery of the first spiral resistive element 310. For example, the number of the thin-film resistive layers 312 of the first spiral resistive element 310 provided more inwardly than the conductive film layer 311*a* (see FIG. 21) of the first spiral resistive element 310 is one, and the number of the thin-film resistive layers 312 of the first spiral resistive element 310 provided more outwardly than the conductive film layer 311*a* is seven.

Even when the components are provided in the planar layout as depicted in FIG. 20, the cross section taken by cutting along a cutting line that passes through the conductive film layers 311*a* to 311*f* of the first spiral resistive element 310 is same as the cross-section of the structure depicted in FIG. 22 except that the number of turns of the spiral wire of the first spiral resistive element 310 and the above two points are different.

The configuration of the cross-section of the structure of the semiconductor device according to the eighth embodiment is same as that of the first embodiment (see FIG. 3) excluding the arrangement of the conductive film layers 311 and the thin-film resistive layers 312 of the first spiral resistive element 310 and the thin-film resistive layer 321 of the second spiral resistive element 320.

All the spiral resistive elements constituting the resistive field plate may include only the thin-film resistive layers by applying the fourth embodiment (see FIG. 11) to the eighth embodiment. In this case, on a lower-layer spiral resistive element, an upper-layer spiral resistive element whose number of the turns of the spiral wire is different from that of the lower-layer spiral resistive element is provided in multiple layers (multi-ply) through the insulating film.

As described above, according to the eighth embodiment, even when the resistive field plate includes only the spiral resistive elements, the same effects as those of the first to the seventh embodiments are achieved.

Figure 23:
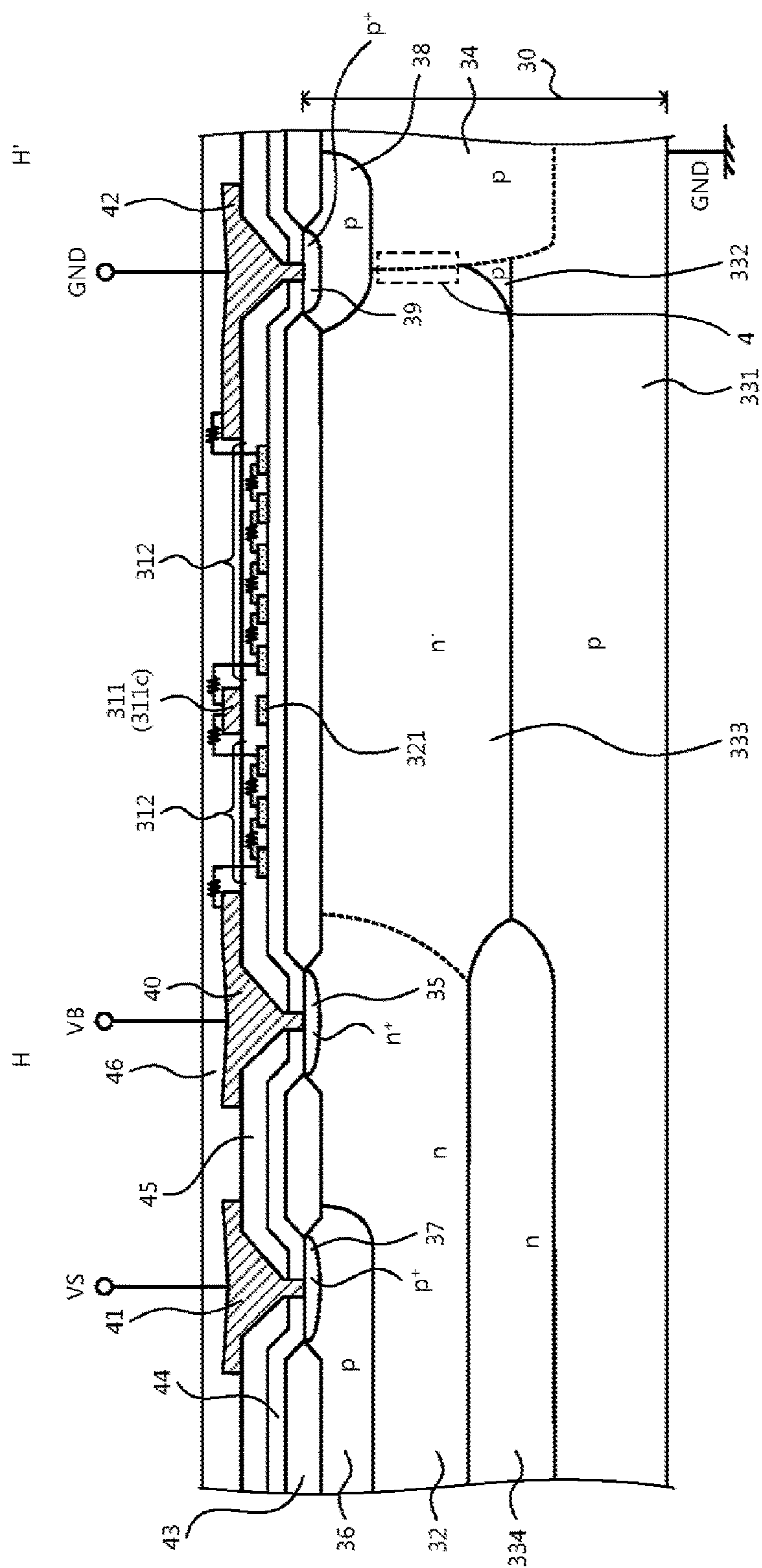
FIGS. 23, 24, and 25 are cross-sectional views of an example of the structure of the semiconductor device according to a ninth embodiment.
Figure 24:
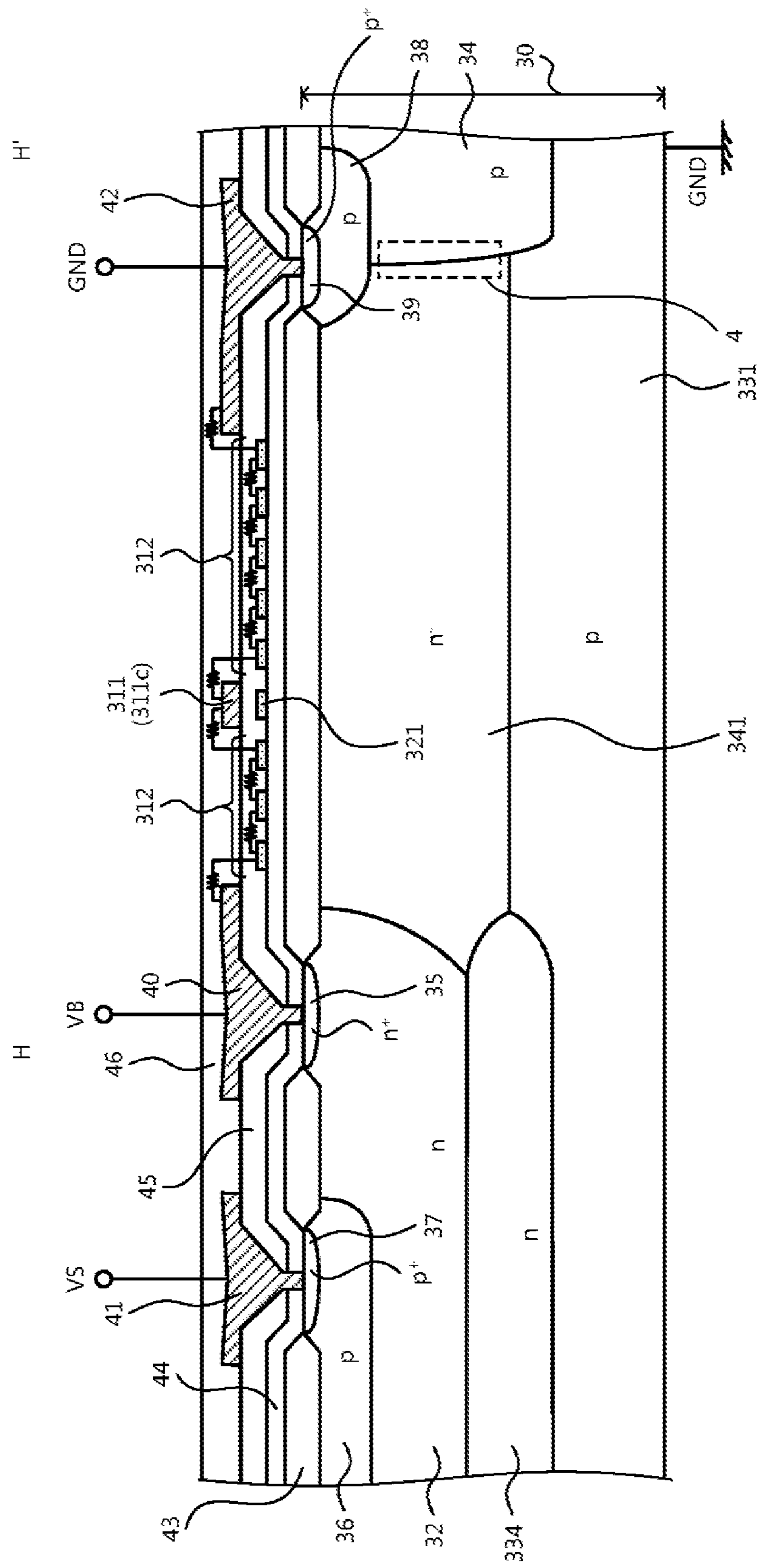
Figure 25:
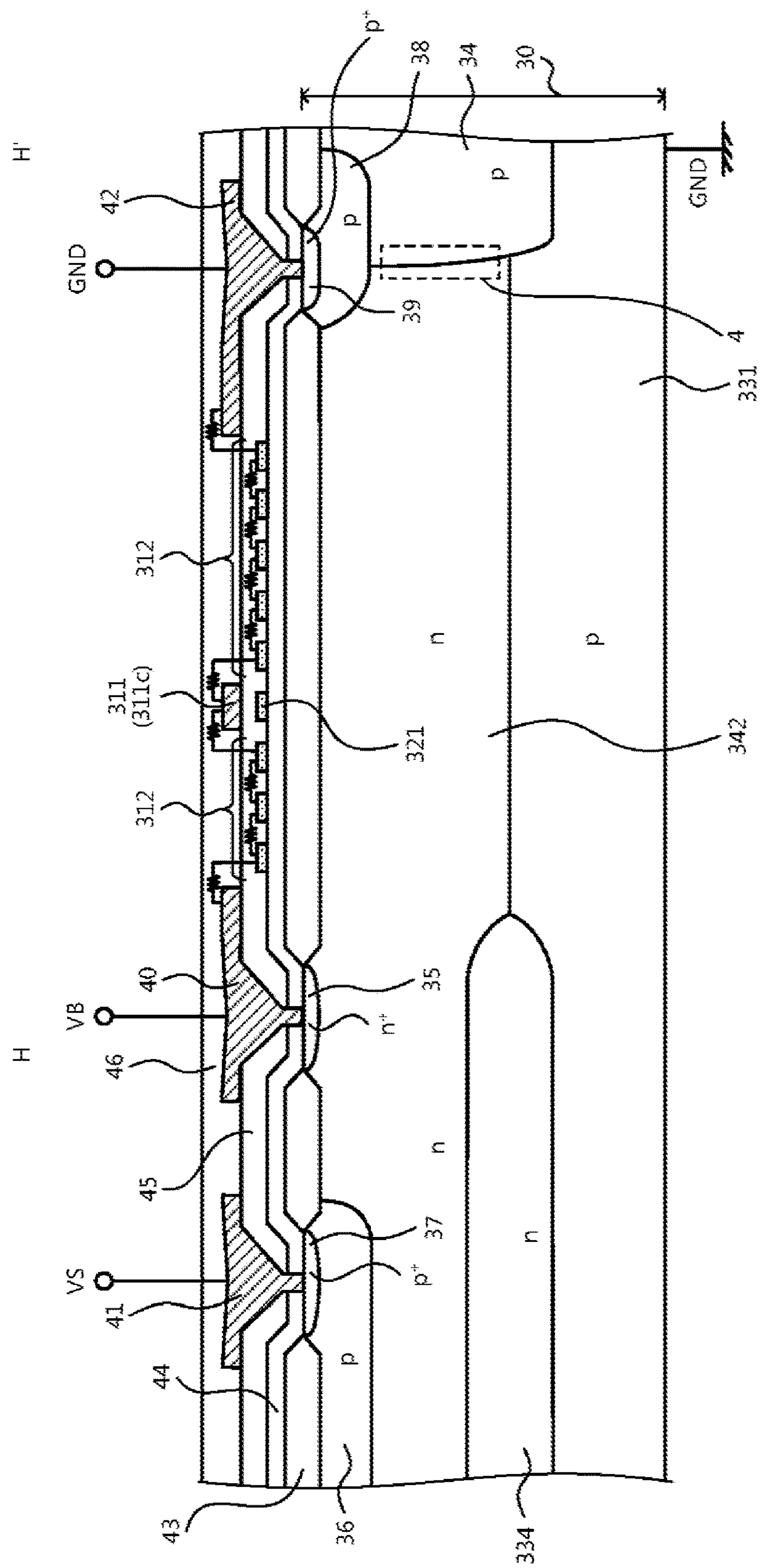

The cross-section of the structure of a semiconductor device according to a ninth embodiment will be described. FIGS. 23, 24, and 25 are cross-sectional views of an example of the structure of the semiconductor device according to the ninth embodiment. FIGS. 23 to 25 depict cross-sections of the structure taken along the cutting line H-H' in FIG. 21. The semiconductor device according to the ninth embodiment differs from the semiconductor device according to the eighth embodiment in the configuration of the regions provided in the p-type semiconductor substrate 30. The arrangement of the first and the second spiral resistive elements 310 and 320, and the electrodes on the p-type semiconductor substrate 30 are same as those of the eighth embodiment. The cross-sections of the structures depicted in FIGS. 23 to 25 will be respectively referred to as a "first cross-sectional structure example" to a "third cross-sectional structure example".

For example, in the first cross-sectional structure example depicted in FIG. 23, the p-type semiconductor substrate 30 is an epitaxial substrate formed by stacking a p-type epitaxially grown layer 332 on the surface of a p-type starting substrate 331. In this case, the p-type epitaxially grown layer 332 functions as a p-type well region that has the low-potential-side region 2 provided therein. The p-type diffusion region 34 therefore does not need to be provided while, when the p-type diffusion region 34 is provided, as indicated by a dotted line in FIG. 23, the p-type diffusion region 34 penetrates the p-type epitaxially grown layer 332, from the front surface of the p-type semiconductor substrate 30 to reach the p-type starting substrate 331.

An $n^-$-type diffusion region 333 is provided in the p-type epitaxially grown layer 332 and reaches the p-type starting substrate 331 from the front surface of the p-type semiconductor substrate 30. The $n^-$-type diffusion region 333 faces, in the depth direction, the thin-film resistive layers 312 and 321 of the first and the second spiral resistive elements 310 and 320 sandwiching the first insulating film 43 and the interlayer insulating film 45 therebetween. The parasitic diode 4 is formed by a pn-junction between the p-type diffusion region 34 (the p-type epitaxially grown layer 332 when the p-type diffusion region is not provided) and the $n^-$-type diffusion region 333. The $n^-$-type diffusion region 333 constitutes the edge termination structure portion 3. The $n^-$-type diffusion region 333 is the region to have a large part of the depletion layer spread therein when a reverse bias is applied to the parasitic diode 4, and this region is referred to as "edge termination region".

The n-type diffusion region 32 constituting the high-potential-side region 1 is provided in the p-type epitaxially grown layer 332 and more inwardly than the thin-film resistive layer 312 of the first spiral resistive element 310, and reaches a point at a predetermined depth from the front surface of the p-type semiconductor substrate 30. An n-type embedded layer 334 is provided between the n-type diffusion region 32 and the p-type starting substrate 331. The n-type embedded layer 334 is in contact with the n-type diffusion region 32 and the p-type starting substrate 331. The $n^-$-type diffusion region 333 may be extended to a position located more inwardly than the thin-film resistive layer 312 of the first spiral resistive element 310 without providing the n-type diffusion region 32.

The p-type semiconductor substrate 30 may be replaced by an epitaxial substrate formed by stacking an $n^-$-type epitaxially grown layer 341 on the surface of the p-type starting substrate 331, as in the second cross-sectional structure example depicted in FIG. 24. In this case, the n-type diffusion region 32 is provided in the $n^-$-type epitaxially grown layer 341 and more inwardly than the thin-film resistive layer 312 of the first spiral resistive element 310, and reaches a point at a predetermined depth from the front surface of the p-type semiconductor substrate 30. Similar to the first cross-sectional structure example in FIG. 23, the n-type embedded layer 334 is provided between the n-type diffusion region 32 and the p-type starting substrate 331.

The p-type diffusion region 34 penetrates the $n^-$-type epitaxially grown layer 341 from the front surface of the p-type semiconductor substrate 30 to reach the p-type starting substrate 331. The parasitic diode 4 is formed by a pn-junction between the p-type diffusion region 34 and the $n^-$-type epitaxially grown layer 341. The p-type diffusion region 34 functions as a p-type well region that has the low-potential-side region 2 provided therein. The $n^-$-type epitaxially grown layer 341 constitutes the edge termination structure portion 3 in a portion thereof that faces, in the depth direction, the thin-film resistive layers 312 and 321 of the first and the second spiral resistive elements 310 and 320, sandwiching the first insulating film 43 and the interlayer insulating film 45 therebetween.

The p-type semiconductor substrate 30 may be replaced by an epitaxial substrate formed by stacking an n-type epitaxially grown layer 342 on the surface of the p-type starting substrate 331, as in the third cross-sectional structure example depicted in FIG. 25. In this case, the n-type diffusion region constituting the high-potential-side region 1 is not provided. The n-type embedded layer 334 is provided between the n-type epitaxially grown layer 342 and the p-type starting substrate 331 and more inwardly than the thin-film resistive layer 312 of the first spiral resistive element 310. The n-type epitaxially grown layer 342 constitutes the high-potential-side region 1 at a position located more inwardly than the thin-film resistive layer 312 of the first spiral resistive element 310.

The p-type diffusion region 34 penetrates the n-type epitaxially grown layer 342 from the front surface of the p-type semiconductor substrate 30 to reach the p-type starting substrate 331. The parasitic diode 4 is formed by a pn-junction between the p-type diffusion region 34 and the n-type epitaxially grown region 342. The p-type diffusion region 34 functions as the p-type well region that has the low-potential-side region 2 provided therein. The n-type epitaxially grown layer 342 constitutes the edge termination structure portion 3 in a portion thereof that faces, in the depth direction, the thin-film resistive layers 312 and 321 of the first and the second spiral resistive elements 310 and 320, sandwiching the first insulating film 43 and the interlayer insulating film 45 therebetween.

The ninth embodiment may be applied to the edge termination structure of the semiconductor device according to the eighth embodiment provided in the planar layout depicted in FIG. 20.

As described above, according to the ninth embodiment, even when the cross-section of the structure of the regions (the semiconductor regions constituting the parasitic diode of the edge termination structure) is different in the p-type semiconductor substrate, the same effects as those of the first to the eighth embodiments are achieved.

In the description above, the present invention may be changed within a scope not departing from the gist of the present invention and is not limited to the embodiments. For example, in the embodiments, although description has been made taking the example of a case where the meander resistive element is used as the sensing resistor, without limitation to a case of use as a sensing resistor, the present invention is applicable to various configurations each including the field plate divided into two or more pieces to be used. Although description has been made in the embodiments taking the example of a case where the meander resistive element is used as the sensing resistor, the spiral resistive element may be used as the sensing resistor. The same effect is achieved in a case where, instead of the meander resistive element, a resistive element provided in a straight line-like planar layout is provided to face, in the depth direction, the spiral resistive element sandwiching the interlayer insulating film therebetween. Although description has been made in the embodiments taking the example of a case where the VB potential, the VS potential, and the between-VB-VS voltage are detected, without limitation hereto, all the potentials and voltages in the high-potential-side region may be detected. Sensing resistors may be provided to further detect other potentials and voltages in addition to the first and the second sensing resistors. Although the first conductivity type is set to be the n-type and the second conductivity type is set to be the p-type in the embodiments, the present invention is similarly implemented even when the first conductivity type is set to be the p-type and the second conductivity type is set to be the n-type.

Figure 16B:
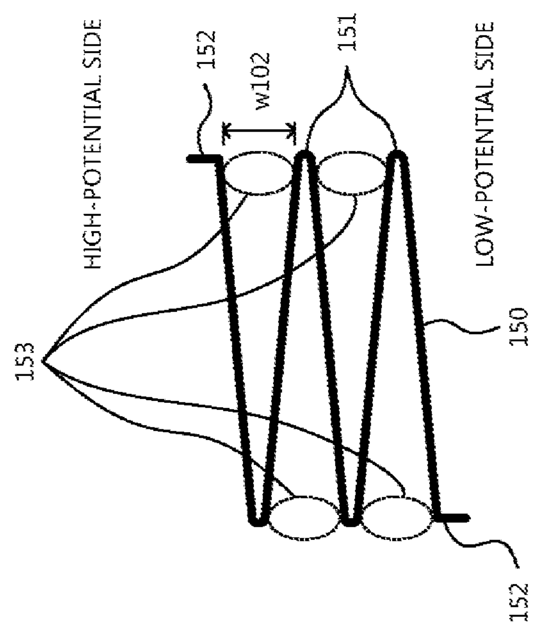
FIGS. 16A and 16B are explanatory diagrams of problematic points of conventional resistive field plates.
Figure 16A:
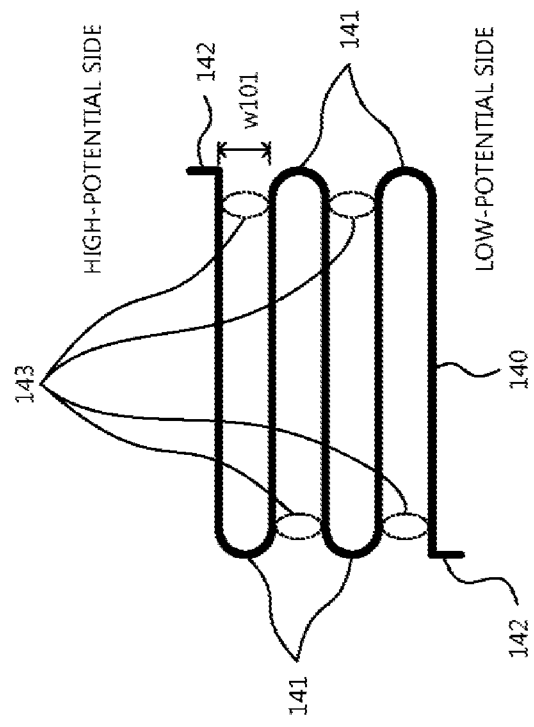
Figure 17:
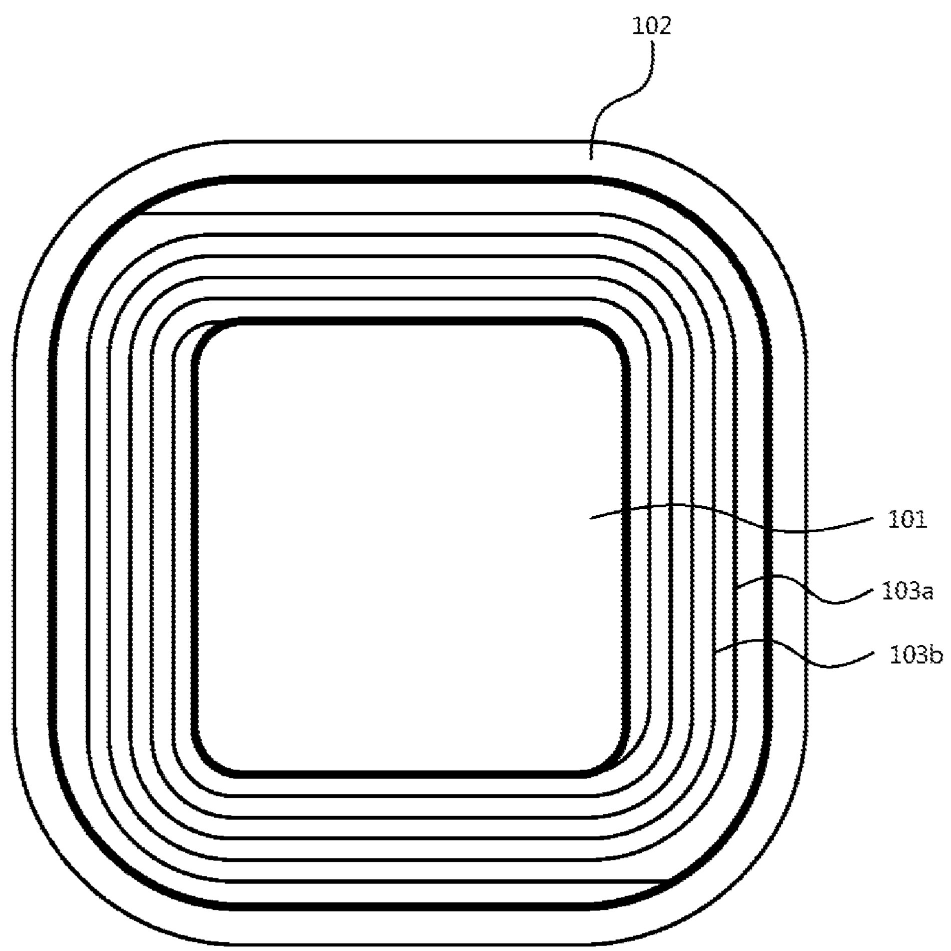
FIGS. 17, 18A, 18B, and 19 are plan diagrams of the planar layout of a conventional resistive field plate.
Figure 18A:
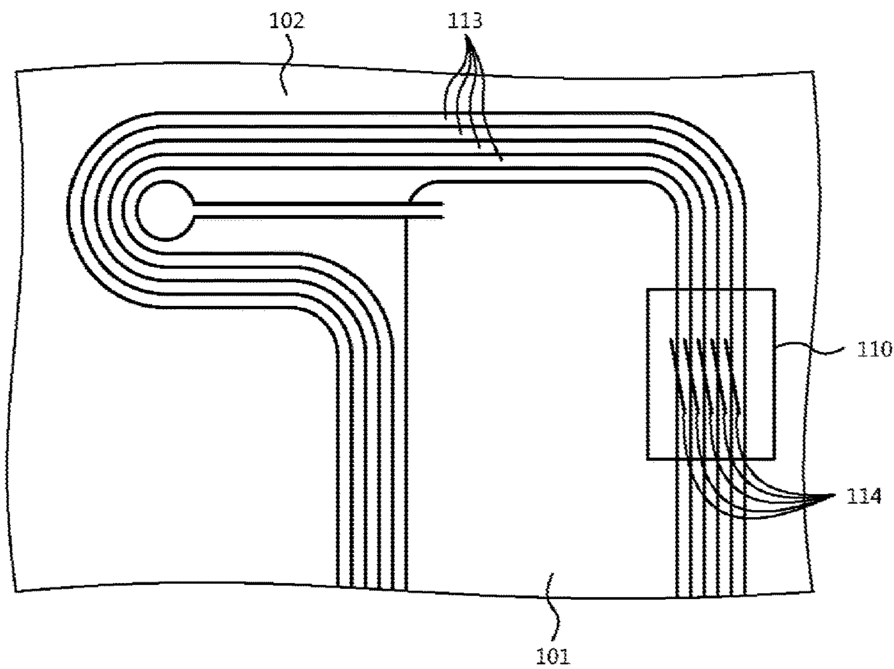
Figure 18B:
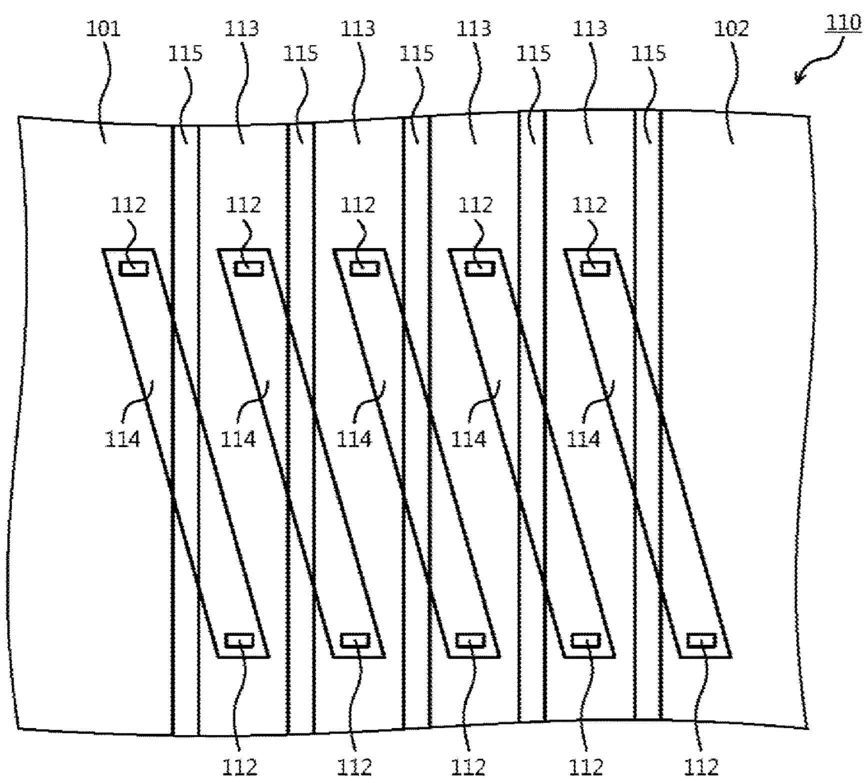
Figure 19:
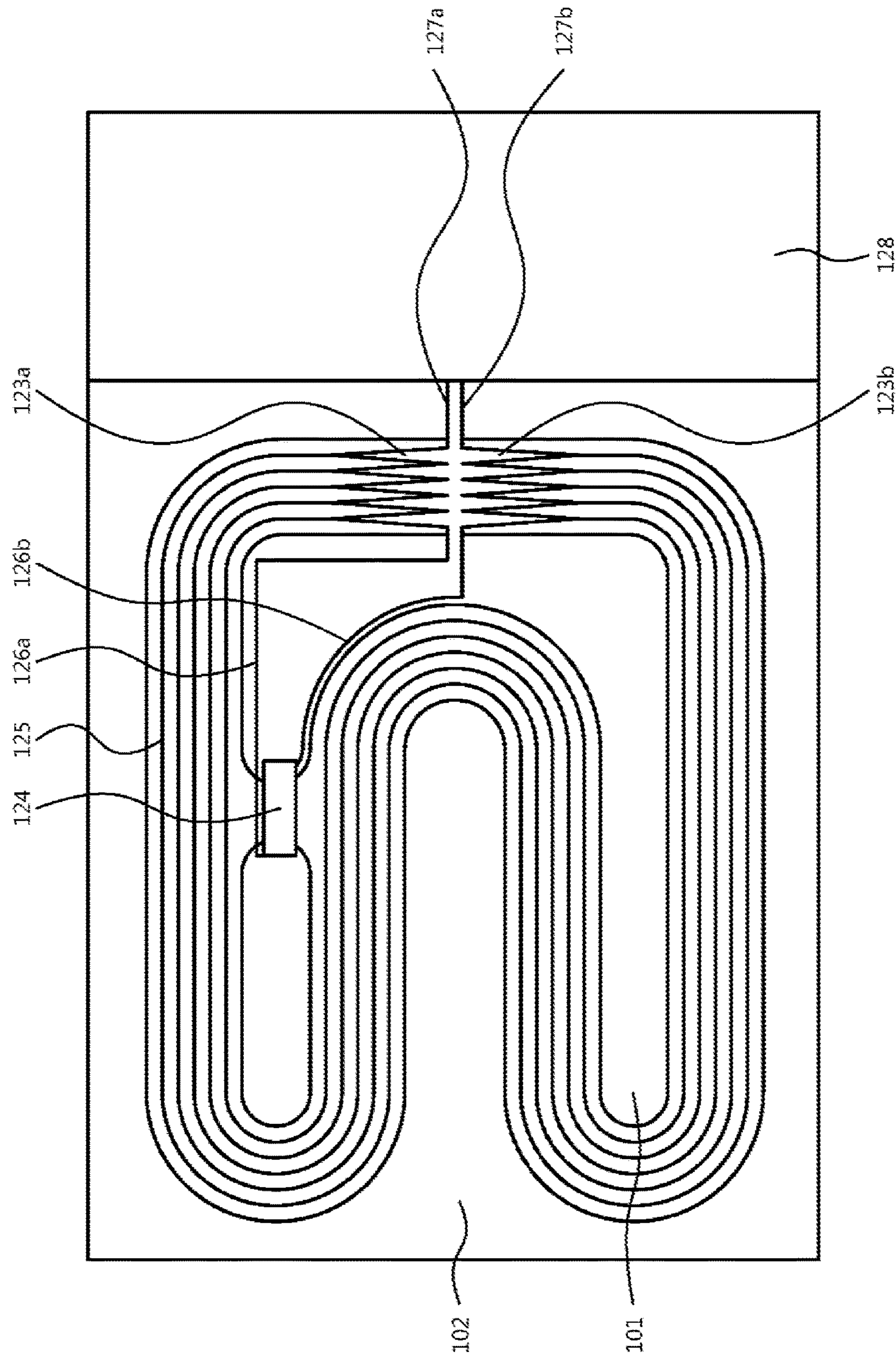

However, with the conventional resistive field plates, the following problems arise. FIGS. 16A and 16B are explanatory diagrams of problematic points of the conventional resistive field plates. When a function of monitoring the voltage of a portion of the resistive field plate (a divided voltage resistor) and detecting the voltage applied to the overall resistive field plate is provided, the product of the resistance value of the resistive field plate and the parasitic capacitance value (an RC time constant) affects the voltage detection time period. Preferably, the resistance value of the resistive field plate is therefore low and the total surface area thereof is small when a portion of the resistive field plate is used as the resistor to detect the voltage (hereinafter, "voltage detection resistor").

In Japanese Laid-Open Patent Publication No. 2000-022175, by increasing the number of the thin-film resistive layers constituting the resistive field plate, one of the thin-film resistive layers may be used as the voltage detection resistor by adjusting the resistance value and the parasitic capacitance value of the one thin-film resistive layer. As to the other thin-film resistive layers, the resistance values thereof are however reduced at a rate equal to that of the one thin-film resistive layer to be used as the voltage detection resistor, and a problem therefore arises that current consumption increases. In Japanese Laid-Open Patent Publication No. 2003-008009 and International Patent Publication No. 2003-533886, because the overall resistive field plate is one continuous component, it is difficult to reduce the total surface area of the resistive field plate. In Japanese Laid-Open Patent Publication No. 2000-022175, Japanese Laid-Open Patent Publication No. 2003-008009, and International Patent Publication No. 2003-533886, the resistance value and the total surface area of the resistive field plate cannot simultaneously be adjusted.

In Japanese Patent Publication No. 5748353, because the plural thin-film resistive layers constituting the resistive field plate are each independently provided, it is also easy to adjust the resistance value and the parasitic capacitance value of only one thin-film resistive layer used as the voltage detection resistor. As depicted in FIG. 16A, however, a thin-film resistive layer 140 is provided in a planar layout to meander in a meandering pattern for a distance w101 between the thin-film resistive layers 140 to be equal. In this case, arch portions 141 substantially at an equal potential are turnaround points of the meandering pattern of the thin-film resistive layer 140, and substantially no voltage drop (voltage burden) occurs in the arch portions 141. Portions 143 of the interlayer insulating film therefore bear the voltage, the portions 143 that are sandwiched between the arch portions 141 of the meandering pattern of the thin-film resistive layer 140, and between the arch portion 141 and an end 142 of the thin-film resistive layer 140 Consequently, the electric field concentrates at the portions 143. Because of this concentration of the electric field, the breakdown voltage decreases relative to that in a case where the thin-film resistive layer is provided in one spiral planar layout.

As depicted in FIG. 16B, this problem may be prevented with a thin-film resistive layer 150 provided in a planar layout to meander in a meandering pattern in which a distance w102 is widened between arch portions 151 that are the turnaround points, whereby decrease of the breakdown voltage is suppressed. The width w102 is widened for portions 153 of the interlayer insulating film sandwiched between the arch portions 151 to be the turnaround points of the meandering pattern of the thin-film resistive layer 150, and between the arch portion 151 and an end 152 of the thin-film resistive layer 150. The region not covered by the thin-film resistive layer 150 is thereby increased and adverse effects of surface charge such as movable ions tend to occur. A new problem therefore arises in that the reliability is degraded such as the occurrence of property fluctuations, malfunctioning, and operation failure, and leak current (leaking current) increases. In Japanese Patent Publication No. 5748353, it is difficult to concurrently secure the breakdown voltage and the reliability.

According to the present invention, the two resistive elements each capable of having conditions set independently therein may be provided being stacked on each other in the up-down direction without increasing the chip area. The first and the second resistive elements each have a function as a field plate having one end thereof connected to a high potential and the other end thereof connected to a low potential. One resistive element alone of the first and the second resistive elements may be used as the voltage detection resistor by reducing the overall length and the total area thereof.

According to the semiconductor device of the present invention, an effect is achieved in that a predetermined breakdown voltage may be secured and reliability may be improved.

As described above, the semiconductor device according to the present invention is useful for, for example, semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a first resistive element formed in an insulating film on a semiconductor substrate, the first resistive element including a first portion and a second portion, the first portion being at a different depth and made of a different material than the second portion; and a second resistive element that differs from the first resistive element, and is formed in the insulating film, the second resistive element located at a different depth in the insulating film as the first portion of the first resistive element, and facing, at least in part, the first portion of the first resistive element with the insulating film therebetween, wherein the first portion is located in a first region of the first resistive element, and the second portion is connected to the first portion and located in a second region of the first resistive element, and the second resistive element has terminals to which external voltages are applied, and are connected with the first resistive element between the terminals.

2. The semiconductor device according to claim 1, wherein a conductive film layer is formed in the first region of the first resistive element, and a thin-film resistive layer is provided in the second region.

3. The semiconductor device according to claim 1, wherein the second resistive element is a thin-film resistive layer.

4. The semiconductor device according to claim 1, wherein the second resistive element is provided in a level same as that of the second portion of the first resistive element.

5. The semiconductor device according to claim 1, wherein the second resistive element is provided in a level different from that of the first resistive element.

6. The semiconductor device according to claim 1, further comprising a first semiconductor region and a second semiconductor region provided in the semiconductor substrate, wherein the first resistive element and the second resistive element each have ends positioned in the first semiconductor region and the second semiconductor region.

7. A semiconductor device, comprising:

a first resistive element formed in an insulating film on a semiconductor substrate, the first resistive element including a first portion and a second portion, the first portion being at a different depth and made of a different material than the second portion;

a second resistive element formed in the insulating film, the second resistive element located at a different depth in the insulating film as the first portion of the first resistive element, and facing, at least in part, the first portion of the first resistive element with the insulating film therebetween;

a second semiconductor region provided in the semiconductor substrate and having a potential fixed to be lower than that of a first semiconductor region; and an edge termination region that is provided between the first semiconductor region and the second semiconductor region, the edge termination region electrically separating the first semiconductor region and the second semiconductor region from each other, wherein the first portion is located in a first region of the first resistive element, and the second portion is connected to the first portion and located in a second region of the first resistive element, and the first resistive element is formed in a spiral planar layout, surrounding a periphery of the first semiconductor region in the edge termination region.

8. The semiconductor device according to claim 7, wherein the second resistive element is provided in a meandering planar layout.

9. The semiconductor device according to claim 8, wherein the second resistive element is provided in a meandering planar layout, and turnaround points of the meandering pattern of the second resistive element are each positioned at a center between adjacent spiral wires of the first resistive element.

10. The semiconductor device according to claim 8, wherein the second resistive element is provided in a meandering planar layout, and turnaround points of the meandering pattern of the second resistive element are positioned on spiral wires of the first resistive element.

11. The semiconductor device according to claim 8, wherein the second resistive element is provided in a meandering planar layout, and the second resistive element has thin-film resistive layers and conductive film layers alternately provided therein each sandwiching a turnaround point of the meandering pattern.

12. The semiconductor device according to claim 7, wherein the second resistive element is provided in a spiral planar layout having a number of turns different from that of the first resistive element.

13. A semiconductor device comprising:

a second semiconductor region provided in a semiconductor substrate and having a potential lower than that of a first semiconductor region;

an edge termination region provided between the first semiconductor region and the second semiconductor region, the edge termination region electrically separating the first semiconductor region and the second semiconductor region from each other;

a first resistive element formed in a spiral planar layout, surrounding a periphery of the first semiconductor region in the edge termination region; and a second resistive element located at a different depth as a first portion of the first resistive element, the second resistive element facing, at least in part, the first portion of the first resistive element and sandwiching an insulating film therebetween, the second resistive element being formed in one of a meandering planar layout and a spiral planar layout having a number of turns different from that of the first resistive element.

14. The semiconductor device according to claim 13, wherein the first resistive element is a thin-film resistive layer.

15. The semiconductor device according to claim 13, wherein the first resistive element includes a conductive film layer provided in the first portion thereof and a thin-film resistive layer in a second portion exclusive of the first portion.

16. The semiconductor device according to claim 13, wherein the second resistive element is provided in a meandering planar layout, and turnaround points of the meandering pattern of the second resistive element are each positioned at a center between adjacent spiral wires of the first resistive element.

17. The semiconductor device according to claim 13, wherein the second resistive element is provided in a meandering planar layout, and turnaround points of the meandering pattern of the second resistive element are positioned on spiral wires of the first resistive element.

18. The semiconductor device according to claim 13, wherein the second resistive element is a thin-film resistive layer.

19. The semiconductor device according to claim 13, wherein the second resistive element is provided in a level same as that of a second portion of the first resistive element exclusive of the first portion of the first resistive element.

20. The semiconductor device according to claim 13, wherein the second resistive element is provided in a level different from that of the first resistive element.

21. The semiconductor device according to claim 13, wherein the second resistive element is provided in a meandering planar layout, and the second resistive element has thin-film resistive layers and conductive film layers alternately provided therein each sandwiching a turnaround point of the meandering pattern.

22. The semiconductor device according to claim 13, wherein the first resistive element and the second resistive element each have ends positioned in the first semiconductor region and the second semiconductor region.

23. A semiconductor device, comprising:

a first resistive element formed in an insulating film on a semiconductor substrate, the first resistive element including a first portion and a second portion, the first portion being at a different depth and made of a different material than the second portion; and a second resistive element that differs from the first resistive element, and is formed in the insulating film, the second resistive element located at a different depth in the insulating film as the first portion of the first resistive element, and facing, at least in part, the first portion of the first resistive element with the insulating film therebetween, wherein the first portion is located in a first region of the first resistive element, and the second portion is connected to the first portion and located in a second region of the first resistive element, and the first resistive element and the second resistive element only have two terminals, respectively, to which external voltages are applied.

* * * * *